(12) United States Patent
Sodano et al.

(10) Patent No.: US 9,193,580 B1
(45) Date of Patent: Nov. 24, 2015

(54) BARIUM TITANATE NANOWIRE THEIR ARRAYS AND ARRAY BASED DEVICES

(71) Applicant: UNIVERSITY OF FLORIDA RESEARCH FOUNDATION, INC., Gainesville, FL (US)

(72) Inventors: Henry A. Sodano, Gainesville, FL (US); Aneesh K. Venkata, Gainesville, FL (US)

(73) Assignee: UNIVERSITY OF FLORIDA RESEARCH FOUNDATION, INC., Gainesville, FL (US)

( * ) Notice: Subject to any disclaimer, the term of this patent is extended or adjusted under 35 U.S.C. 154(b) by 0 days.

(21) Appl. No.: 14/531,843

(22) Filed: Nov. 3, 2014

Related U.S. Application Data

(60) Provisional application No. 61/898,825, filed on Nov. 1, 2013.

(51) Int. Cl.
*B81B 3/00* (2006.01)
*B81C 1/00* (2006.01)
*B81C 3/00* (2006.01)

(52) U.S. Cl.
CPC ............. *B81B 3/0021* (2013.01); *B81C 1/0019* (2013.01); *B81C 3/005* (2013.01)

(58) Field of Classification Search
CPC ............ H01H 59/0009; G01P 15/0802; B81B 2203/0118; B81B 3/0021; B81C 1/0019; B81C 3/005
USPC ........................................................ 257/415
See application file for complete search history.

(56) References Cited

U.S. PATENT DOCUMENTS

2010/0136414 A1* 6/2010 Choi et al. .................... 429/156
2011/0187240 A1* 8/2011 Hsu et al. ...................... 310/367

OTHER PUBLICATIONS

Im, Badro, et al. "Growth of single crystalline barium titanate nanowires from TiO2 seeds deposited on conducting glass." Nanotechnology 21.42 (2010): 425601.*
Kumar, Akshay, Anuj R. Madaria, and Chongwu Zhou. "Growth of aligned single-crystalline rutile TiO2 nanowires on arbitrary substrated and their application in dye-sensitized solar cells," The Journal of Physical Chemistry C 114.17 (2010): 7787-7792.*
Albarbar, A. et al., "Performance evaluation of MEMS accelerometers," *Measurement*, 2009, pp. 790-795, vol. 42.
Bao, N. et al., "Shape-Controlled Monocrystalline Ferroelectric Barium Titanate Nanostructures: From Nanotubes and Nanowires to Ordered Nanostructures," *J. Phys. Chem. C*, 2008, pp. 8634-8642, vol. 112.
Bao, N. et al., "Size-controlled one-dimensional monocrystalline BaTiO 3 nanostructures," *Applied Physics Letters*, 2009, pp. 253109(1-4), vol. 94.

(Continued)

*Primary Examiner* — Karen Kusumakar
*Assistant Examiner* — Adam S Bowen
(74) *Attorney, Agent, or Firm* — Saliwanchik, Lloyd & Eisenschenk

(57) ABSTRACT

A nano-electromechanical system comprises piezoelectric vertically aligned BaTiO$_3$ nanowire arrays for energy-harvesting applications, sensors, and other applications. The aligned piezoelectric nanowire arrays provide highly accurate nano-electromechanical system-based dynamic sensor with a wide operating bandwidth and unity coherence and energy harvesters at low frequencies. The growth of vertically aligned (B45-mm long) barium titanate nanowire arrays is realized through a hydrothermal synthesis.

5 Claims, 21 Drawing Sheets

(56) References Cited

OTHER PUBLICATIONS

Cha, S.N. et al., "Sound-Driven Piezoelectric Nanowire-Based Nanogenerators," *Adv. Mater.*, 2010, pp. 4726-4730, vol. 22.

Challa, V.R. et al., "A coupled piezoelectric-electromagnetic energy harvesting technique for achieving increased power output through damping matching," *Smart Mater. Struct.*, 2009, pp. 095029, 1-11, vol. 18.

Chang, J. et al., "Piezoelectric nanofibers for energy scavenging applications," *Nano Energy*, 2012, pp. 356-371, vol. 1.

Chatterjee, S. et al., "Hydrothermally Synthesized Aligned Arrays of Self-Assembled Mutiwalled Hydrogen Titanate Nanotubes," *Crystal Growth & Design*, 2010, pp. 1215-1220, vol. 10.

Chen, X. et al., "1.6 V Nanogenerator for Mechanical Energy Harvesting Using PZT Nanofibers," *Nano Letters*, 2010, pp. 2133-2137, vol. 10.

Chen, C-Y. et al., "Electricity generation based on vertically aligned $PbZr_{0.2}Ti_{0.8}O_3$ nanowire arrays," *Nano Energy*, 2012, pp. 424-428, vol. 1.

Chen, D., et al., "Well-ordered arrays of ferroelectric single-crystalline $BaTiO_3$ nanostructures," *Phys. Status Solidi A*, 2012, pp. 714-717, No. 4.

Choi, W.J. et al., "Energy harvesting MEMS device based on thin film piezoelectric cantilevers," *J Electroceram*, 2006, pp. 543-548, vol. 17.

Choi, M-Y. et al., "Mechanically Powered Transparent Flexible Charge-Generating Nanodevices with Piezoelectric ZnO Nanorods," *Adv. Mater.*, 2009, pp. 2185-2189, vol. 21.

Espinosa, H.D. et al., "A Review of Mechanical and Electromechanical Properties of Piezoelectric Nanowires," *Adv. Mater.*, 2012, pp. 4656-4675, vol. 24.

Falconi, C. et al., "Studying piezoelectric nanowires and nanowalls for energy harvesting," *Sensors and Actuators B*, 2009, pp. 511-519, vol. 139.

Galan, U. et al., "Effect of ZnO nanowire morphology on the interfacial strength of nanowire coated carbon fibers," *Composites Science and Technology*, 2011, pp. 946-954, vol. 71.

Gao, P.X. et al., "Nanowire Piezoelectric Nanogenerators on Plastic Substrates as Flexible Power Sources for Nanodevices," *Adv. Mater.*, 2007, pp. 67-72, vol. 19.

Greene, L.E. et al., "Solution-Grown Zinc Oxide Nanowires," *Inorganic Chemistry*, 2006, pp. 7535-7543, vol. 45, No. 19.

Hansen, B.J. et al., "Hybrid Nanogenerator for Concurrently Harvesting Biomechanical and Biochemical Energy," *ACS Nano*, pp. 3647-3652, vol. 4, No. 7.

Hu, Y. et al., "Replacing a Battery by a Nanogenerator with 20 V Output," *Adv. Mater.*, 2012, pp. 110-114, vol. 24.

Huang, L. et al., "Barium titanate nanocrystals and nanocrystal thin films: Synthesis, ferroelectricity and dielectric properties," *Journal of Applied Physics*, 2006, pp. 034316 (1-11), vol. 100.

Huang, K-C. et al., "Morphology-Controlled Synthesis of Barium Titanate Nanostructures," *Inorganic Chemistry*, 2009, pp. 9180-9184, vol. 48.

Im, B. et al., "Growth of single crystalline barium titanate nanowires from $TiO_2$ seeds deposited on conducting glass," *Nanotechnology*, 2010, pp. 425601 (1-5), vol. 21.

Joshi, U.A. et al., "Surfactant-Free Hydrothermal Synthesis of Highly Tetragonal Barium Titanate Nanowires: A Structural Investigation," *J. Phys. Chem. B.*, 2006, pp. 12249-12256, vol. 110.

Kang, S-O. et al., "Growth Mechanism of Shape-Controlled Barium Titanate Nanostructures through Soft Chemical Reaction," *Crystal Growth & Design*, 2008, pp. 3180-3186, vol. 8, No. 9

Koka, A. et al., "Vibration Sensing and Energy Harvesting Using Ultra-Long Vertically Alligned Array of Barium Titanate Nanowires," Proceedings of the *ASME 2012 Conference on Smart Materials, Adaptive Structures and Intelligent Systems*, Sep. 19-21, 2012, Stone Mountain, Georgia, USA.

Koka, A. et al., "Vertically aligned $BaTiO_3$ nanowire arrays for energy harvesting," *Energy & Environmental Science*, 2014, pp. 288-296, vol. 7.

Kong, N. et al., "Resistive Impedance Matching Circuit for Piezoelectric Energy Harvesting," *Journal of Intelligent Material Systems and Structures*, 2010, pp. 1293-1302, vol. 21.

Kralchevsky, P.A. et al., "Capillary Forces between Colloidal Particles," *Langmuir*, 1994, pp. 23-36, vol. 10.

Kumar, B. et al., "Energy harvesting based on semiconducting piezoelectric ZnO nanostructures," *Nano Energy*, 2012, pp. 342-355, vol. 1.

Lao, C.S. et al., "ZnO Nanobelt/Nanowire Schottky Diodes Formed by Dielectrophoresis Alignment across Au Electrodes," *Nano Letters*, 2006, pp. 263-266, vol. 6, No. 2.

Leontsev, S.O. et. al., "Progress in engineering high strain lead-free piezoelectric ceramics," *Sci. Technol. Adv. Mater.*, 2010, pp. 044302 (1-13), vol. 11.

Lin, Y. et al., "Hydrothermal synthesis of vertically aligned lead zirconate titanate nanowire arrays," *Applied Physics Letters*, 2009, pp. 122901 (1-3), vol. 95.

Lin, Z-H. et al., "$BaTiO_3$ Nanotubes-Based Flexible and Transparent Nanogenerators," *The Journal of Physical Chemistry Letters*, 2012, pp. 3599-3604, vol. 3.

Liu, W.Q. et al., "The influence of preamplifiers on the piezoelectric sensor's dynamic property," Review of Scientific Instruments, 2007, pp. 125107 (1-4), vol. 78.

Liu, J. et al., "Toward high output-power nanogenerator," *Applied Physics Letters*, 2008, pp. 173105 (1-3), vol. 92.

Liu, B. et al., "Oriented single crystalline titanium dioxide nanowires," *Nanotechnology*, 2008, pp. 505604 (1-7), vol. 19.

Liu, B. et al., "Growth of Oriented Single-Crystalline Rutile $TiO_2$ Nanorods on Transparent Conducting Substrates for Dye-Sensitized Solar Cells," *J. Am. Chem. Soc.*, 2009, pp. 3985-3990, vol. 131.

Maxim, F. et al., "Hydrothermal Synthesis and Crystal Growth Studies of $BaTiO_3$ Using Ti Nanotube Precursors," *Crystal Growth & Design*, 2008, pp. 3309-3315, vol. 8, No. 9.

McCormick, M.A. et al., "Microstructure development and dielectric properties of hydrothermal $BaTiO_3$ thin films," *Journal of European Ceramic Society*, 2003, pp. 2143-2152, vol. 23.

Merz, W.J., "Domain Formation and Domain Wall Motions in Ferroelectric $BaTiO_3$ Single Crystals," *Physical Review*, 1954, pp. 690-704, vol. 95, No. 3.

Morgado, Jr., E. et al., "A study on the structure and thermal stability of titanate nanotubes as a function of sodium content," *Solid State Sciences*, 2006, pp. 888-900, vol. 8.

Nechibvute, A. et al., "Piezoelectric Energy Harvesting Devices: An Alternative Energy Source for Wireless Sensors," Smart Materials Research, 2012, pp. 1-13.

Panda, P.K. et al., "Review: environmental friendly lead-free piezoelectric materials," *J Mater Sci*, 2009, pp. 5049-5062, vol. 44.

Park, K-I. et al., "Piezoelectric $BaTiO_3$ Thin Film Nanogenerator on Plastic Substrates," *Nano Letters*, 2010, pp. 4939-4943, vol. 10.

Pham, T.T. et al., "Reliable operation of a nanogenerator under ultraviolet light via engineered piezoelectric potential," *Energy & Environmental Science*, 2013, pp. 841-846, vol. 6.

Priya, S. "Advances in energy harvesting using low profile piezoelectric transducers," *J Electroceram*, 2007, pp. 165-182, vol. 19.

Qi, Y. et al., "Piezoelectric Ribbons Printed onto Rubber for Flexible Energy Conversion," *Nano Letters*, 2010, pp. 524-528, vol. 10.

Qi, Y. et al., "Enhanced Piezoelectricity and Stretchability in Energy Harvesting Devices Fabricated from Buckled PZT Ribbons," *Nano Letters*, 2011, pp. 1331-1336, vol. 11.

Røorvik, P.M. et al., "One-Dimensional Nanostructures of Ferroelectric Perovskites," *Adv. Mater.*, 2011, pp. 4007-4034, vol. 23.

Shen, D. et al., "The design, fabrication and evaluation of a MEMS PZT cantilever with an integrated Si proof mass for vibration energy harvesting," J. Micromech. Microeng., pp. 055017 (1-7), vol. 18.

Sohn, J.I. et al., "Engineering of efficiency limiting free carriers and an interfacial energy barrier for an enhanced piezoelectric generation," *Energy & Environmental Science*, 2013, pp. 97-104, vol. 6.

Sun, C. et al., "Fundamental study of mechanical energy harvesting using piezoelectric nanostructures," *Journal of Applied Physics*, 2010, pp. 034309 (1-11), vol. 108.

Tadigadapa, S. et al., "Piezoelectric MEMS sensors: state-of-the-art and perspectives," *Meas. Sci. Technol.*, 2009, pp. 092001 (1-30), vol. 20.

(56) References Cited

OTHER PUBLICATIONS

Tian, J-H. et al., "Improved seedless hydrothermal synthesis of dense and ultralong ZnO nanowires," *Nanotechnology*, 2011, pp. 245601 (1-9), vol. 22.

Urban, J.J. et al., "Synthesis of Single-Crystalline Perovskite Nanorods Composed of Barium Titanate and Strontium Titanate," *J. Am. Chem. Soc.*, 2002, pp. 1186-1187, vol. 124, No. 7.

Urban, J.J. et al., "Single-Crystalline Barium Titanate Nanowires," *Adv. Mater.*, 2003, pp. 423-426, vol. 15, No. 5.

Wang, Z.L. et al., "Piezoelectric Nanogenerators Based on Zinc Oxide Nanowire Arrays," *Science*, 2006, pp. 242-246, vol. 312, No. 5771.

Wang, X. et al., "Piezoelectric Field Effect Transistor and Nanoforce Sensor Based on a Single ZnO Nanowire," *Nano Letters*, 2006, pp. 2768-2772, vol. 6, No. 12.

Wang, X. et al., "Direct-Current Nanogenerator Driven by Ultrasonic Waves," *Science*, 2007, pp. 102-105, vol. 316, No. 5821.

Wang, X. et al., "Integrated Nanogenerators in Biofluid," *Nano Letters*, 2007, pp. 2475-2479, vol. 7, No. 8.

Wang, Z. et al., "Axial polarization switching in ferroelectric $BaTiO_3$ nanowire," *Nanotechnology*, 2007, pp. 235203 (1-4), vol. 18.

Wang, Z. et al., "Voltage Generation from Individual $BaTiO_3$ Nanowires under Periodic Tensile Mechanical Load," *Nano Letters*, 2007, pp. 2966-2969, vol. 7, No. 10.

Wang, Z.L., "Piezotronic and Piezophototronic Effects," *The Journal of Physical Chemistry Letters*, 2010, pp. 1388-1393, vol. 1.

Wang, Z.L., "Self-Powered Nanosensors and Nanosystems," *Adv. Mater.*, 2012, pp. 280-285, vol. 24.

Wang, X., "Piezoelectric nanogenerators—Harvesting ambient mechanical energy at the nanometer scale," *Nano Energy*, 2012, pp. 13-24, vol. 1.

Wen, X. et al., "Seedless synthesis of patterned ZnO nanowire arrays on metal thin films (Au, Ag, Cu, Sn) and their application for flexible electromechanical sensing," *J. Mater. Chem.*, 2012, pp. 9469-9476, vol. 22.

Williams, M.D. et al., "An AlN MEMS Piezoelectric Microphone for Aeroacoustic Applications," Journal of Microelectromechanical Systems, 2012, pp. 270-283, vol. 21, No. 2.

Wu, Z. et al., "Investigations on procedures of the fabrication of barium titanate ceramic films under hydrothermal—electrochemical conditions," *Solid State Ionics*, 1999, pp. 161-172, vol. 122.

Wu, W. et al., "Taxel-Addressable Matrix of Vertical-Nanowire Piezotronic Transistors for Active and Adaptive Tactile Imaging," *Science*, 2013, pp. 952-957, vol. 340.

Xu, S. et al., "Self-powered nanowire devices," *Nature Nanotechnology*, 2010, pp. 366-373, vol. 5.

Xu, C. et al., "Two-Stage Hydrothermal Growth of Long ZnO Nanowires for Efficient $TiO_2$ Nanotube-Based Dye-Sensitized Solar Cells," *J. Phys. Chem. C*, 2012, pp. 7236-7241, vol. 116.

Yan, Z. et al., "Surface effects on the electromechanical coupling and bending behaviours of piezoelectric nanowires," *J. Phys. D: Appl. Phys.*, 2011, pp. 075404 (1-6), vol. 44.

Yang, R. et al., "Characteristics of output voltage and current of integrated nanogenerators," *Applied Physics Letters*, 2009, pp. 022905 (1-3), vol. 94.

Yang, R. et al., "Converting Biomechanical Energy into Electricity by a Muscle-Movement-Driven Nanogenerator," 2009, *Nano Letters*, pp. 1201-1205, vol. 9, No. 3.

Yu, A. et al., "Nanogenerator as self-powered vibration sensor," *Nano Energy*, 2012, pp. 418-423, vol. 1.

Zárate, R.A. et al., "Chemical composition and phase identification of sodium titanate nanostructures grown from titania by hydrothermal processing," *Journal of Physics and Chemistry of Solids*, 2007, pp. 628-637, vol. 68.

Zhou, J. et al., "Flexible Piezotronic Strain Sensor," *Nano Letters*, 2008, pp. 3035-3040, vol. 8, No. 9.

Zhou, Z. et al., "Hydrothermal growth of highly textured $BaTiO_3$ films composed of nanowires," *Nanotechnology*, 2013, pp. 095602 (1-7), vol. 24.

Zhu, G. et al., Functional Electrical Stimulation by Nanogenerator with 58 V Output Voltage, *Nano Letters*, 2012, pp. 3086-3090, vol. 12.

Koka, A. et al., High-sensitivity accelerometer composed of ultra-long, vertically aligned barium titanate nanowire arrays, *Nature Communications*, 2013, 4:2682 (Supplemental information also included).

Xu, S. et al., "Piezoelectric-Nanowire-Enabled Power Source for Driving Wireless Microelectronics" *Nature Communications*, 2010, pp. 93-97, vol. 1, No. 7.

Park, K. et al., "Bendable and Transparent Barium Titanate Capacitors on Plastic Substrates for High Performance Flexible Ferroelectric Devices" *Electrochemical and Solid-State Letters*, 2010, pp. G57-G59, vol. 13, No. 7.

Tang H. et al., Synthesis of High Aspect Ratio BaTiO3 Nanowires for High Energy Density Nanocomposite Capacitors, *Adv. Energy Mater.*, 2012, pp. 451-456, vol. 3.

Linear Technology data sheet, [online, webpage, retrieved Aug. 5, 2013] from: www.linear.com/docs/8817. "LTC6240/LTC6241/LTC6242 Single/Dual/Quad 18MHz, Low Noise, Rail-to-Rail Output, CMOS Op Amps," pp. 1-32.

* cited by examiner

BARIUM TITANATE NANOWIRE THEIR ARRAYS AND ARRAY BASED DEVICES

CROSS-REFERENCE TO RELATED APPLICATION

The present application claims the benefit of U.S. Provisional Application Ser. No. 61/898,825, filed Nov. 1, 2013, which is hereby incorporated by reference herein in its entirety, including any figures, tables, or drawings.

This invention was made with government support under FA9550-12-1-0132 awarded by the Air Force Office of Scientific Research. The government has certain rights in the invention.

BACKGROUND OF INVENTION

Piezoelectric materials offer coupling between mechanical and electrical energy, allowing them to be effectively fabricated as transducers that can be configured as either sensors or actuators. Many sensing applications incorporate piezoelectric materials, because they require minimal signal conditioning and have wide bandwidth well into the MHz range. Furthermore, piezoelectric materials have been found particularly well suited for micro-electromechanical systems (MEMS), as the energy density does not decrease with the dimensions, as is the case in electromechanical or magneto-mechanical systems. When applied in MEMS applications, piezoceramics are typically constrained to a thin film, which places certain limits on the design of the device and typically requires the use of the lower $k_{31}$ piezoelectric coefficient (1). An alternative configuration for sensors is vertically aligned piezoelectric nanowire (NW) arrays that allow for facile interfacing with electrical interconnects. Piezoelectric nanowires have evoked tremendous curiosity in the field of nanotechnology for energy applications primarily due to their excellent electro-mechanical energy conversion capabilities which are unchanged as the scale is reduced and, in addition to their ability to be utilized in advanced sensors, they can function as sufficient power sources for certain low power wireless electronic devices and miniature autonomous systems [1,2]. Power generating nano-electro-mechanical system (NEMs) fabricated using piezoelectric nanowires have become renowned in the research community, as they are able to convert several different sources of mechanical energy into electric power, such as: sound waves [3]; ultrasonic waves [4-6]; vibrational energy [7,8]; atomic force microscope tip induced stimuli [9,10]; and biomechanical energy [11,12].

The power generating capacity of devices based on aligned piezoelectric ZnO nanowire (NWs) arrays has been studied rigorously and it has been reported that the energy conversion efficiency of such a device is sufficiently high for production of electricity that can potentially power nanosystems [9]. The direct piezoelectric effect responsible for the energy-harvesting behavior is identical to the response required for sensing. However, energy harvesting represents a more simplistic operation, as the voltage output can contain significant noise, requires little to no correlation to the input energy and places no limits on the bandwidth or stability of the response. On the contrary, a functional sensor must produce an output that can be very accurately correlated to the force (mechanical measurands) acting on it and without noise that would limit the sensitivity and measurement floor. Among the piezoelectric NEMs, those made of ferroelectric perovskite nanostructures and thin films such as PZT ($PbZr_xTi_{1-x}O_3$) [8, 13-15], and Barium Titanate ($BaTiO_3$) [16-18] can produce greater energy due to their higher electro-mechanical coupling coefficients and thereby, provide an efficient means to harvest mechanical energy. The NW form of these materials offers considerable advantages due to the high aspect ratio, which leads to highly deformable structures [19, 20] and size effects [21] that act to enhance the piezoelectricity of the ceramic. Consequently, piezoelectric NWs have tremendous potential to be applied in the emerging field of nano-electromechanical systems (NEMS).

However, environmental concerns over the use of lead based piezoelectric materials have enhanced the need to develop and utilize lead-free $BaTiO_3$ nanostructures. Moreover, prior to this study the synthesis of vertically aligned arrays of $BaTiO_3$ nanowires (NWs) had not been developed and thus this high performance lead free composition has received little attention. Previously, Wang et al. [19] performed a numerical analysis to show that the $BaTiO_3$ NWs have higher power generating capability as compared to ZnO NWs for the same size. Recently, Wang et al. [20] applied ZnO NWs as vibration sensors to detect the resonance characteristics of a cantilever beam and evaluated the voltage generating performance. Although ZnO NWs have garnered significant interest for sensing and energy harvesting, a low piezoelectric coupling coefficient and semiconductor behavior are unlike many ferroelectric ceramics and, therefore, sensors therefrom show low sensitivity and a high noise floor [22]. Although ZnO NWs have a low dielectric constant, which increases its voltage output, the performance has been very limited and no sensor has been demonstrated to produce a high coherence between the input and output across the sensor's bandwidth [3, 23-25]. Ferroelectric perovskite nanostructures such as PZT ($PbZr_xTi_{1-x}O_3$) [13, 26, 27] NWs improve the electromechanical coupling performance of NW-based devices; however, they have only been applied for energy harvesting applications as the environmental concerns with lead-based piezoelectric materials encourages the use of lead-free piezoelectric nanostructures for sensors [28]. Among lead-free ceramics, barium titanate ($BaTiO_3$) possesses one of the highest coupling values. However, no synthesis method for the growth of vertically aligned $BaTiO_3$ NW arrays has been demonstrated prior to the inventors' efforts, and thus this high-performance lead-free material has received little attention in the NW form. Herein the preparation of ultra-long and short $BaTiO_3$ nanowires by two methods and their use for the preparation of sensors and energy harvesting devices

SUMMARY OF THE INVENTION

The preparations, piezoelectric behaviors, and fabrications of device from ultra-long and short vertically aligned array of $BaTiO_3$ NWs are utilized to fabricate vibration sensors and energy harvesting devices by modifying top electrode configurations. High voltages were obtained at low frequencies from a sensor followed by a flat band region in the FRF observed from white noise excitation with Harming window, correlating well with even sine wave excitation of the sensor and, therefore, frequency preservation is validated. In one embodiment of the invention, a cantilever Indium top electrode with low resonant frequency was used to apply $BaTiO_3$ NWs for energy harvesting applications. The added tip mass on the beam resulted in resonant peak shift and magnitude increase in the FRF to clearly indicate piezoelectric behavior of the $BaTiO_3$ NWs.

In another embodiment of the invention, a novel NEMS sensor comprises vertically aligned array of ultra-long, $BaTiO_3$ NWs to utilize their piezoelectric behavior to detect acceleration from mechanical vibration source. This piezoelectric NW-based sensor shows excellent coherence, linearity and wide operating bandwidth over a frequency spectrum that spans up to 10 kHz. The resonant frequency from the NW sensor can be adjusted by varying the seismic mass during the fabrication process and, thereby, provides control over the sensitivity and operating frequency bandwidth of the $BaTiO_3$ NW-based sensor to suit different application requirements.

In another embodiment of the invention, NEMS vibrational energy harvesters are fabricated with resonant frequencies that are less than 200 Hz using vertically aligned ferroelectric $BaTiO_3$ NW arrays that are about 1 μm long on a conductive FTO glass. Superior vibrational energy harvesting capability of the $BaTiO_3$ NW arrays is achieved. This power density, peak open circuit voltage, and peak short circuit current levels at resonant frequency measured from these $BaTiO_3$ NW based NEMS energy harvester are significantly greater than the response recorded from a ZnO based NEMS energy harvester, where the power density of the $BaTiO_3$ NEMS energy harvester is comparable to many meso-scale and MEMS-scale resonant vibrational energy harvesters.

DETAILED DISCLOSURE

According to an embodiment of the invention, $BaTiO_3$ is prepared as an array of vertically aligned nanowires. In another embodiment of the invention, the vertically aligned $BaTiO_3$ nanowires are used to form NEM devices. The NEM devices can be a vibration sensor with a wide operating frequency bandwidth or a vibrational energy harvester when excited near resonant frequency.

According to an embodiment of the invention, ultra-long (up to 45 mm), vertically aligned $BaTiO_3$ NW arrays are achieved through a low-cost, two-step hydrothermal growth method. These NWs piezoelectric function as energy-harvesting material and can be used to fabricate NEMS accelerometers with high sensitivity, unity coherence, and wide operating bandwidth. High sensitivity of ~50 m $Vg^{-1}$ is demonstrated from the NEMS sensor composed of vertically aligned $BaTiO_3$ NW arrays, which is much higher than the sensitivity of ZnO NW sensor (~2.5 $Vg^{-1}$) under the same conditions.

Figure 1:
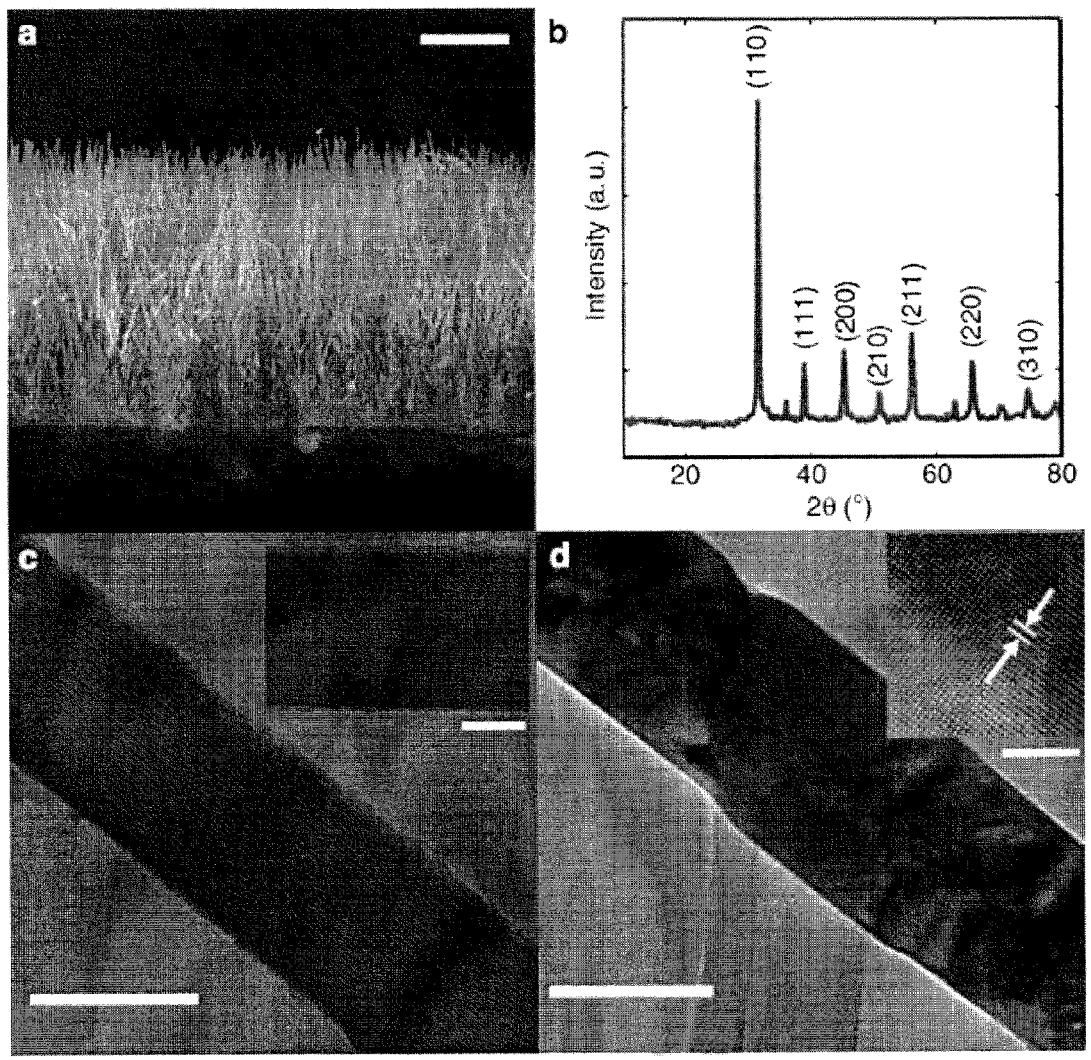
FIG. 1. Characterization of $BaTiO_3$ NW arrays: (a) A cross-sectional SEM image of BaTiO3 NW arrays (scale bar, 20 mm); (b) XRD spectrum from the $BaTiO_3$ NW arrays (JCPDS number 5-0626) synthesized using sodium titanate NW arrays as precursor; (c) An HRTEM image of the single-crystal sodium titanate NW precursor (scale bar, 100 nm) with the inset showing the clear crystal lattice fringes (scale bar, 25 nm); and (d) An HRTEM image of the single $BaTiO_3$ NW showing single-crystal structure after ion transfer (scale bar, 100 nm), with the inset showing the clear crystal lattice fringes (scale bar, 5 nm; arrows are used to indicate the crystal lattice spacing distance of 4.12 Å).

A hydrothermal process is employed to grow vertically aligned $BaTiO_3$ NW arrays permits surfaces to be tailored using MEMS processing. For example, isolated patches of NWs can be fabricated such that sensing arrays can be used to achieve extremely high spatial resolution. The preparation of the $BaTiO_3$ NW arrays occurs through the conversion of vertically aligned sodium titanate NW arrays that is grown on an oxidized titanium substrate. The nanowires' microstructure was characterized using scanning electron microscopy (SEM), as shown in FIG. 1a, and high-resolution transmission electron microscope (HRTEM). The $BaTiO_3$ NW arrays span, for example, a length of 45 mm and the diameter of the individual NWs are 600 nm. These dimensions were chosen such that the NWs are sufficiently rigid to allow their use in compression without buckling or wicking together during drying [29]. The crystallographic structure of the NWs was analyzed using X-ray diffraction (XRD), and the XRD pattern in FIG. 1b shows the NWs are $BaTiO_3$ (JCPDS number 5-0626). The HRTEM image of the as-prepared sodium titanate NW precursors showed a single crystalline structure, as shown in FIG. 1c, which is transforms into a single crystalline $BaTiO_3$ NW after a second hydrothermal reaction containing barium ions as shown in FIG. 1d. To retain the vertically aligned morphology of the precursor sodium titanate NW arrays, the concentration of the barium ($Ba^{2+}$) ions used in the second hydrothermal treatment is very low. Structural transformation from sodium titanate NW precursor to a single crystal $BaTiO_3$ NW results by the diffusion of the barium ($Ba^{2+}$) ions into the sodium titanate NWs from the temperature assisted hydrothermal ion-exchange reaction[30, 31].

Figure 3:
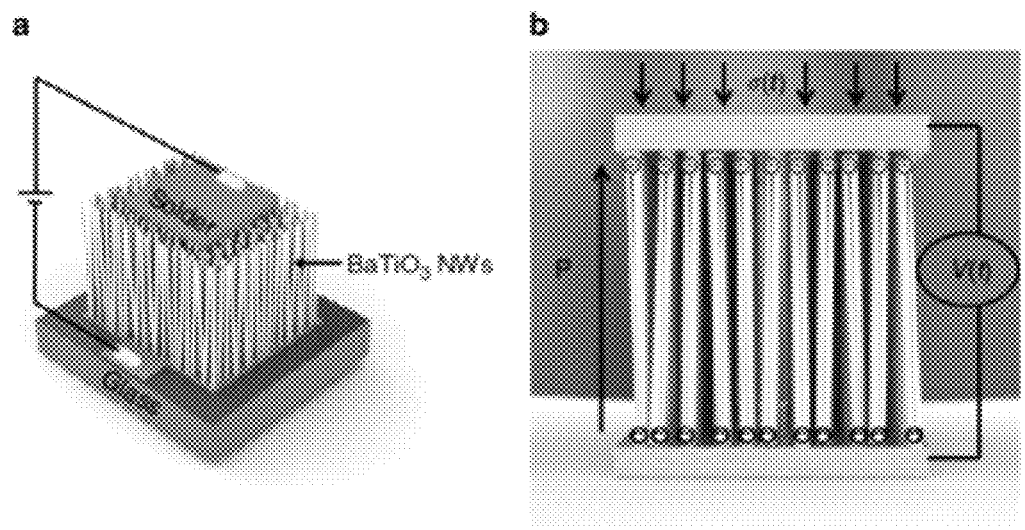
FIG. 3. Shows a sensor device configuration where: (a) schematic diagram of sensor device using $BaTiO_3$ NW arrays; and (b) schematic of piezoelectric voltage generation from NWs Polarization direction (P) represents the alignment direction of the dipoles; with application of dynamic stress (s(t)) on NW arrays produces voltage (V(t)) generation.

Sensor are fabricated from the vertically aligned $BaTiO_3$ NW arrays by first removing the NW arrays from the oxidized titanium substrate on which they were grown to a borosilicate glass substrate. The NW arrays are released from the oxidized growth substrate by immersing in dilute HCl solution. The NW arrays are bonded to the glass substrate using silver epoxy, which acted as a bottom electrode, and a thin solder foil (Sn60Pb40) was applied to the top surface of the NWs, which forms the top electrode. The NW arrays with the solder foil were heated to 150° C. for 1 h to improve bonding with the NWs. The two electrodes sandwiched the vertically aligned $BaTiO_3$ NW arrays, with the glass acting as the substrate for handling and mounting to the excitation source as shown in the schematic in FIG. 3. After fabrication, the $BaTiO_3$ NW arrays were polled by applying a DC field of ~75 $kVcm^{-1}$ across the two electrodes of the sensor for 12 h. The denser layer of $BaTiO_3$ NWs near the base electrode assists to insulate the sandwich structure from breakdown during the poling process [32, 33]. High-voltage poling is performed to ensure the dipoles in the $BaTiO_3$ NW arrays align in the electric field direction, which is normal to the plane of the two electrodes and along the orientation of the NWs. Poling is not required for non-ferroelectric piezoceramic materials such as ZnO; however, it is critical for the piezoelectric function of the single-crystal $BaTiO_3$ NWs.

Figure 4:
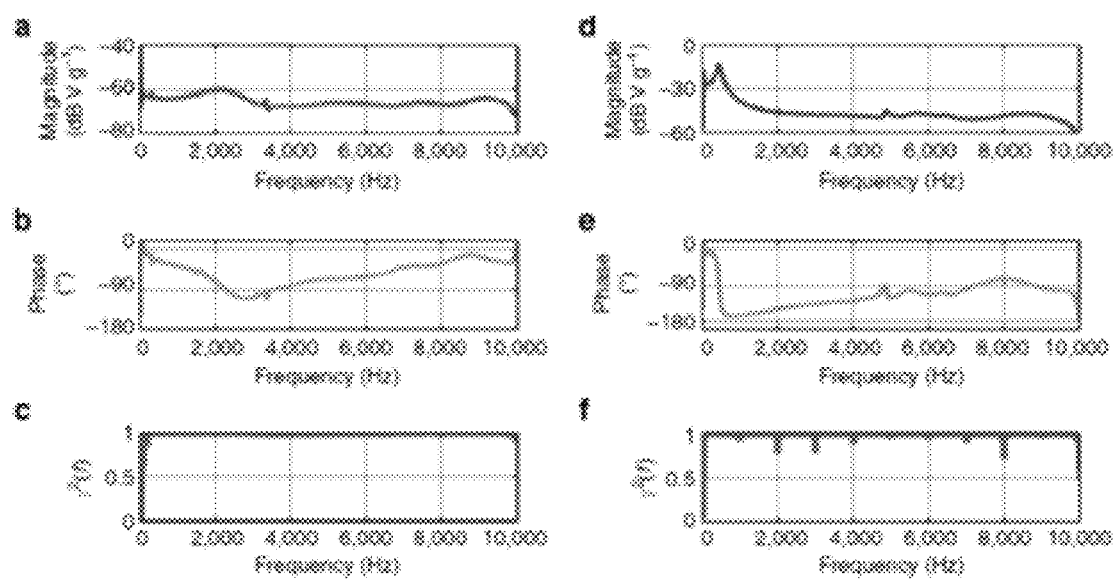
FIG. 4. Dynamic response characterization of $BaTiO_3$ NW sensor: (a) FRF illustrated by magnitude in dB scale of $Vg^{-1}$; (b) phase angle in degree; (c) the coherence function ($γ^2f$) of $BaTiO_3$ NW sensors with a heated solder as the top electrode demonstrated flat band region with strong unity coherence up to 10,000 Hz from white noise excitation; (d) FRF illustrated by magnitude in dB scale of $Vg^{-1}$; (e) phase angle in degree; and (f) the coherence function ($γ^2f$) of $BaTiO_3$ NW sensors with an added mass on the top electrode produced a resonance frequency at 450 Hz and demonstrated enhanced sensitivity (B50 $mVg^{-1}$) in the ±3 dB flat band region of up to 300 Hz.

Acceleration is determined by mounting the sensor to a vibrating surface and then measuring the piezoelectric potential formed due to the dynamic stress resulting from the inertia of the solder on the NWs' top surface (FIG. 4b). When the stress applied is constant or removed from the NWs, the accumulated charge is dissipated and the resulting piezoelectric voltage diminishes, and the piezoelectric material is limited to dynamic sensing applications. The generated piezoelectric voltage depends on the direction, amplitude, and frequency of the stress that is applied on the sensor, having a dynamic characteristics of a linear system. The sensor detects the inertia from the top electrode that imposes the time varying compressive and tensile stress on the vertically aligned $BaTiO_3$ NW arrays that is needed for sensing. The stress on the NWs is proportional to the acceleration of the base and, therefore, the NWs produce a voltage proportional to the acceleration of the device.

The open-circuit piezoelectric voltage output is of the $BaTiO_4$ devices can be measured using a high impedance voltage follower (1 TΩ), where test measurements are advantageously performed inside a grounded faraday cage to eliminate the effects of extraneous noise on the sensor output voltage. A voltage follower such as the LTC6240CS8 used for exemplary devices can use its very low-input bias current (0.2 pA) to function as an efficient voltage measuring the interface circuit for the piezoelectric NW sensor. Placing the voltage follower is near the sensor minimizes leakage current during measurement from a sensor source, where high input impedance (low capacitance) counteracts parasitic capacitance that can adversely affect the sensor's actual sensitivity. The grounded faraday cage shields electromagnetic interference to improve the signal-to-noise ratio of the sensor. Therefore, there is little detrimental extrinsic noise at the input and output points to affect the sensor's linear characteristics.

The dynamic characteristics of the novel compression-type $BaTiO_3$ NW-based accelerometer are described using the frequency response function (FRF). The FRF defines the relative magnitude and phase between the reference sensor (PCB 352C22), which produces an accurate measure of the input acceleration acting on the device, and the output piezoelectric voltage of the NW sensor. These characteristics and the sensitivity define the ultimate performance of the sensor. Linearity and validity of the sensor's measurement are evaluated using the coherence function, which represents the degree of linearity between the input base acceleration (instrumentation-grade accelerometer) and the output piezoelectric voltage of the NW sensor [34, 35]. The coherence is a nonlinear function with values from 0 to 1, with 1 defining a perfect linear relationship between the two signals permitting an accurate measure of the input [35]. The coherence drops below unity in the presence of noise, non-linearity in the measured oscillations, or spurious frequencies in the output. A stationary Gaussian white noise signal is used for excitation of the base, due to its spectral density being flat across the entire test frequency that spans up to 10 kHz.

The thin film of solder that is attached to the top of the NWs as a top electrode provides the mass (16 mg) for acceleration sensing and is utilized in two different settings to analyze the sensing behavior of the $BaTiO_3$ NWs. The solder is heated to form a stable rigid contact with the NWs, resulting in a flat band magnitude response in FRF (FIG. 4a) of up to 10 kHz with only a slight phase variation (FIG. 4b). The flat band response region is essential to characterize the sensor's operating frequency range and is observed due to the resonant frequency of the sensor device falling above the bandwidth of the excitation. The coherence function is very strong, reaching unity across the entire test frequency range, and thereby demonstrates the accurate measurement of acceleration from the NW arrays (FIG. 4c). A mean sensitivity of 800 $mVg^{-1}$ is obtained in the ±3 dB flat band region in the FRF magnitude that spans across the entire frequency range where 'g' represents the acceleration due to gravity. Here the sensitivity is lower but the operating bandwidth of the sensor spans up to 10 kHz.

Figure 5:
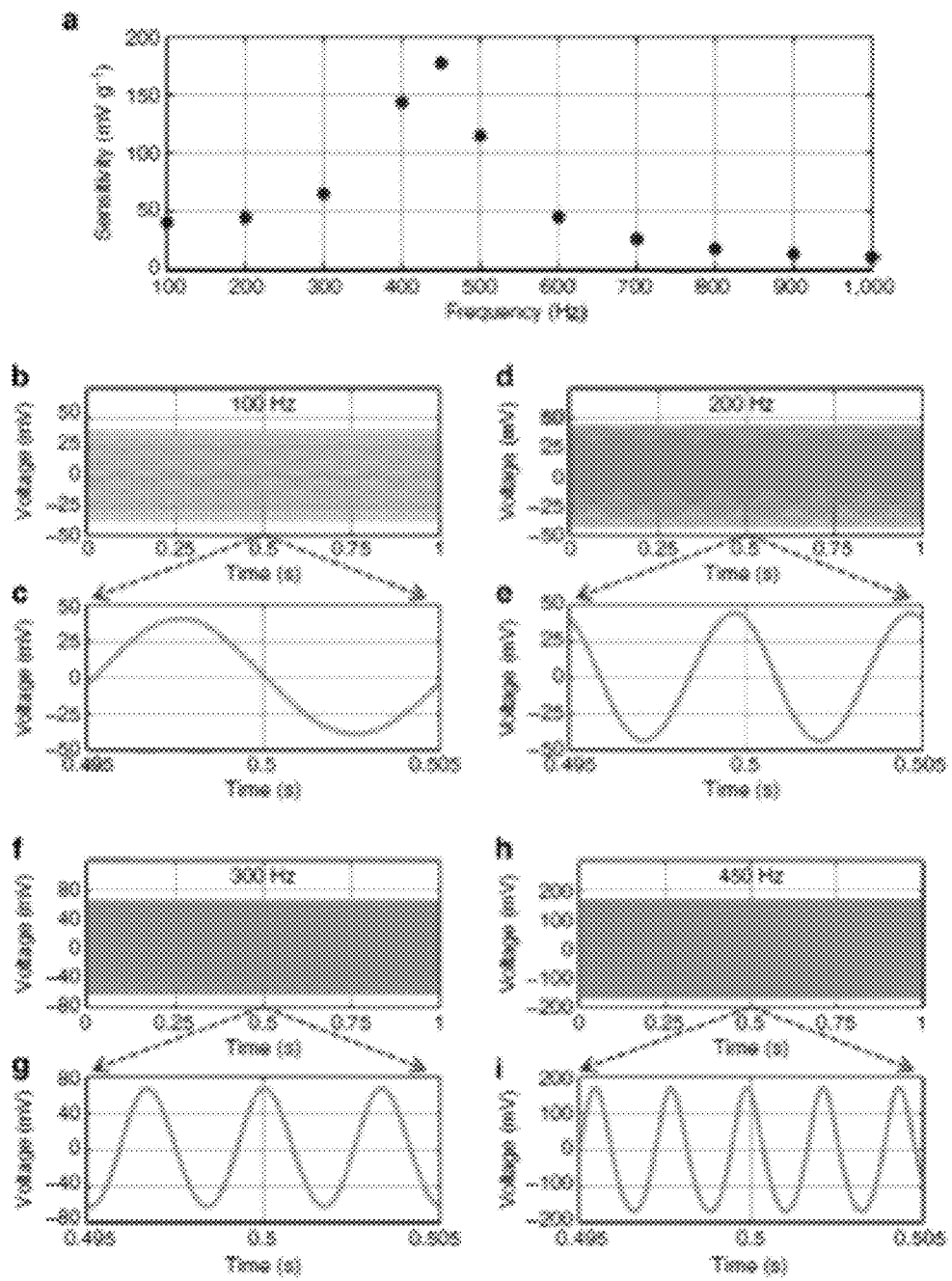
FIG. 5. Sinusoidal excitation on $BaTiO_3$ NW sensor: (a) RMS sensitivity from frequencies of 100-1,000 Hz; (b) Voltage measured at 100 Hz with (c) showing the detailed shape; (d) Voltage measured at 200 Hz with (e) showing the detailed shape; (f) voltage measured at 300 Hz with (g) showing the detailed shape where voltage measured at 100 (b), 200 (d) and 300 Hz (f) from 1 g amplitude acceleration input correlates well with the mean RMS sensitivity of ~50 mV up to 300 Hz; and (h) voltage measured near resonant frequency (450 Hz) with (i) clearly showing the detailed shape of a high Vpp of 342 mV produced at resonance from 1 g amplitude acceleration input.

Higher mass of the top electrode decreases the resonant frequency permitting a measurable frequency within the shaker's bandwidth, which confirms the existence of a high-frequency resonance of the unloaded device. By considering the NW arrays as a spring, increased mass decreases the resonant frequency (450 Hz) as observed in the FRF magnitude in FIG. 3d associated with 90° FRF phase shift at the resonant frequency (FIG. 4e). Added mass on the sensor's top electrode enhances the dynamic stress level on the sensing NWs, resulting in improved piezoelectric voltage generation from the sensor. The FRF from the loaded sensor substantiates this behavior, as there is a considerable increase in the magnitude, which equates to a higher mean sensitivity of 50 mVg$^{-1}$ in the ±3 dB bandwidth of the sensor that spans up to 300 Hz. The coherence is observed to be unity, confirming the accuracy of the FRF measurement made from the loaded sensor (FIG. 4f). Although sensitivity is higher, operating bandwidth is reduced, which is a "trade-off" in the performance of the sensor. A sine wave excitation is performed to confirm frequency preservation. Using input sinusoidal acceleration amplitude of 1 g, root mean square (RMS) sensitivity is calculated, showing a peak of ~180 mVg$^{-1}$ at the resonance frequency (450 Hz) of the loaded sensor as shown in FIG. 5a. A high mean RMS sensitivity of ~50 mVg$^{-1}$ is obtained up to 300 Hz, which correlates well with the FRF magnitude, indicating that the loaded sensor is well suited for accurate low frequency acceleration measurements. Moreover, the acceleration noise floor (minimum detectable signal) from the NW accelerometer is low (~0.005 g) owing to the higher sensitivity and lower-voltage noise floor (RMS B250 mV) in the operating bandwidth. Peak-to-peak voltage (Vpp) of ~80, ~85 and ~130 mV is obtained at 100 (FIG. 5b), 200 (FIGS. 5d) and 300 Hz (FIG. 5o, respectively, for a 1 g input acceleration sinusoidal amplitude with the corresponding detailed shapes shown in FIG. 5c,e,g. High Vpp, of ~340 mV, is obtained from only 1 g acceleration amplitude from the sensor near resonance (FIG. 5h,i). Therefore, the results recorded from the novel BaTiO$_3$ NW accelerometer demonstrate the potential of the NWs to have a dual role in sensing and in power harvesting applications.

Figure 6:
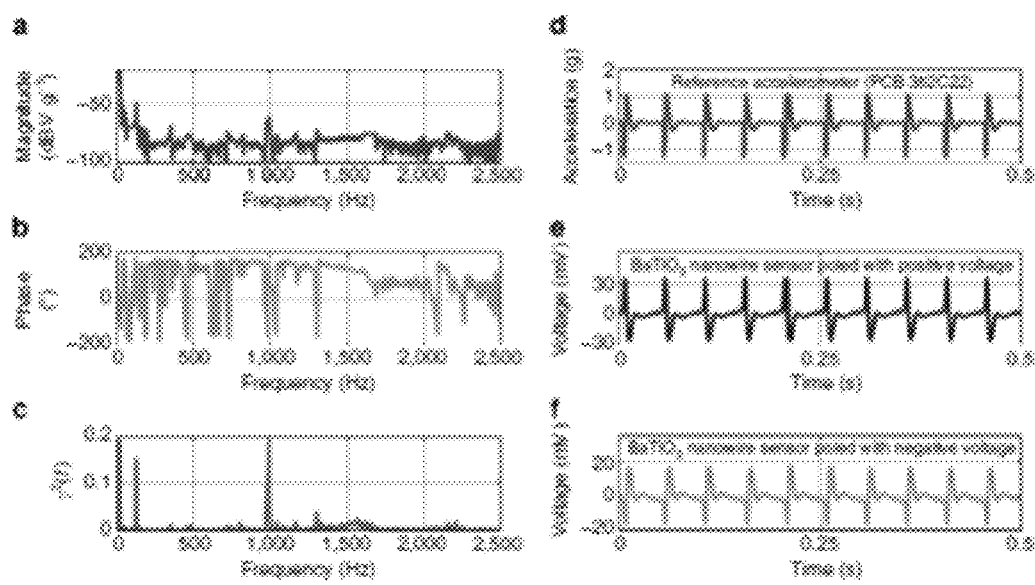
FIG. 6. Influence of depoling and switchable polarization direction: (a) FRF illustrated by magnitude in dB scale of Vg_1; (b) phase angle in degree; (c) the coherence function ($γ^2f$) of $BaTiO_3$ NW sensors under white noise excitation when heated to 150° C. for 3 h (Curie temperature, TC=120° C.), which shows the loss in piezoelectric behavior from depoling as the electric dipoles in the NWs have been relaxed from their oriented poled state to random directions; (d) acceleration measured by reference accelerometer (PCB 352C22) to low-frequency pulse input; (e) the output voltage response (V) from the same $BaTiO_3$ NW sensor to pulse input measured after poling it with positive voltage (75 $kVcm^{-1}$ DC field); and (f) then poling it with negative voltage (−75 $kVcm^{-1}$ DC field) to investigate the influence of reversing the polarization direction (P) on the output, where the sensor is connected with same terminals to voltage follower to demonstrate the reversing output voltage signal (V) (e,f) from the same mechanical deformation by switching the polarization direction (P) to confirm that the measured voltage response from the sensor is generated by ferroelectric $BaTiO_3$ NW arrays.

The piezoelectric behavior of the BaTiO$_3$ NW accelerometer was verified by heating the accelerometer above the Curie temperature of the BaTiO$_3$, 120° C., to relax the orientation of the electric dipoles, which eliminates the formation of a net charge on the sensor under stress [36]. The depoled NW sensor was tested under white noise excitation and produced no measureable signal in FRF and showed a loss in coherence, which confirms the transition from tetragonal phase to cubic phase of the BaTiO$_3$ NWs on heating above the Curie temperature (FIG. 6a-c) [35]. In addition, poling/depoling/repoling analysis and switching polarity test were performed for BaTiO$_3$ NEMS sensor to validate piezoelectricity from ferroelectric BaTiO$_3$ NW arrays [37, 38]. When the poling voltage (DC field 75 kV cm$^{-1}$) is reversed in polarity to switch the polarization direction (P) of the electric dipoles within the ferroelectric BaTiO$_3$ NW arrays of the same sensor with the polarization direction (P) switched in two opposite directions, a reversal in the peaks (polarity) of the output voltage response (V) from the same NW sensor is observed for identical mechanical deformation when connected with same terminals to the voltage follower, as shown in FIG. 6d-f. This demonstrates the switchable polarization direction (P) property of ferroelectric BaTiO$_3$ NW arrays and its influence on output voltage response (V) which confirms that the presence of piezoelectric property in the ferroelectric BaTiO$_3$ NW arrays is responsible for high sensitivity, unity coherence and excellent linearity in a wide operating bandwidth from the NW accelerometer that was poled before testing.

Figure 7:
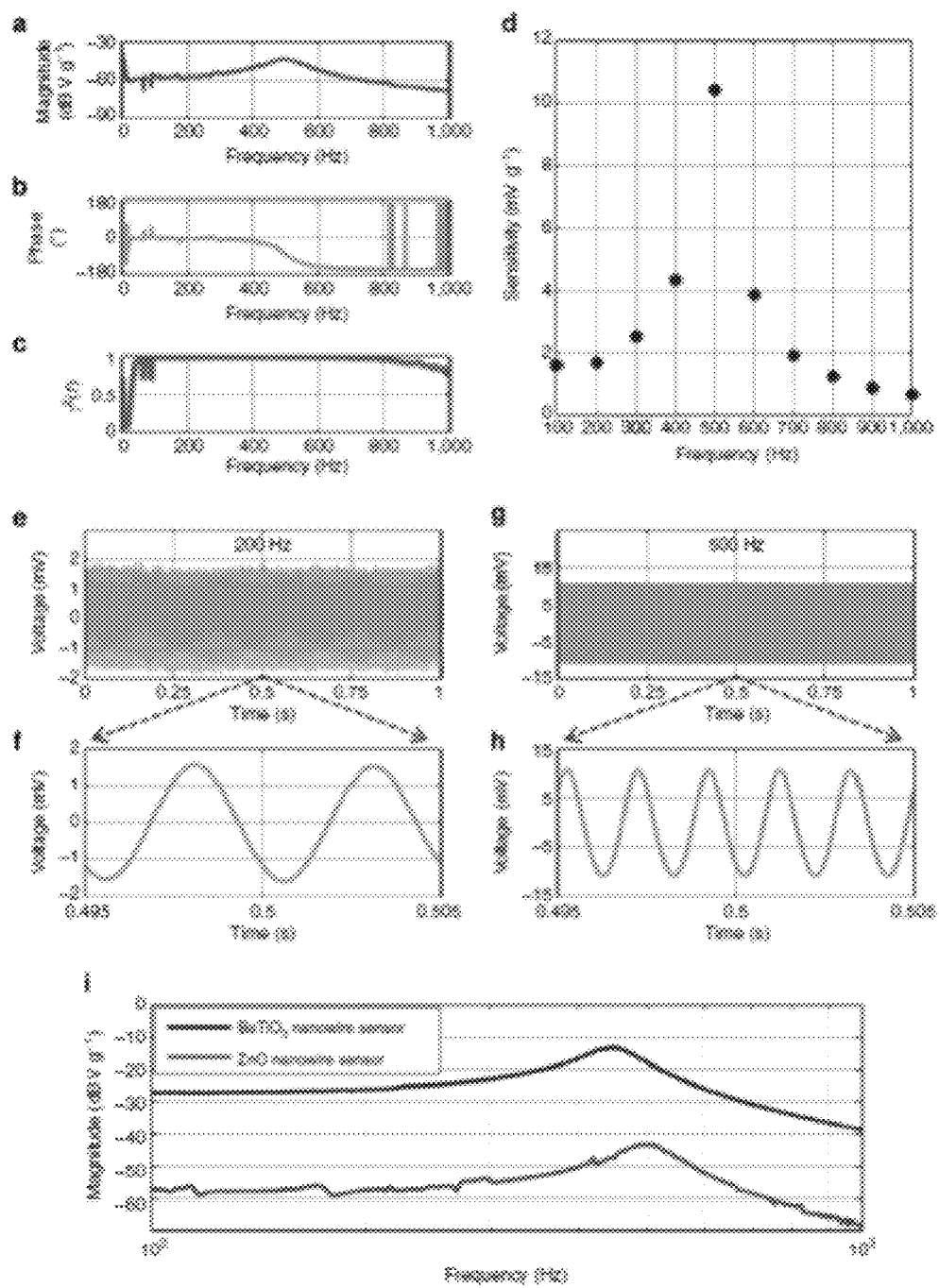
FIG. 7. Characterization and comparison of ZnO NW NEMS sensor: (a) FRF illustrated by magnitude in dB scale of $Vg^{-1}$; (b) phase angle in degree; (c) the coherence function ($γ^2f$) of ZnO NW sensors obtained from white noise excitation; (d) RMS sensitivity from frequencies ranging from 100 to 1,000 Hz from sinusoidal excitation; (e) Voltage measured at 200 Hz from 1 g amplitude acceleration input with (f) showing detailed shape with a Vpp of ~3.8 mV; (g) voltage measured near resonant frequency (500 Hz) showing a Vpp of ~22 mV from 1 g amplitude acceleration input with (h) showing the detailed shape; and (i) comparison of magnitude of the FRF with frequency axis in log scale to clearly depict the higher ±3 dB flat band sensitivity of ~50 $mVg^{-1}$ from $BaTiO_3$ NW sensors as compared with ±3 dB sensitivity of ~2.5 $mVg^{-1}$ from ZnO NW sensors up to ~350 Hz.

The superior sensing performance of the ultra-long, vertically aligned BaTiO$_3$ NW arrays is demonstrated in comparison to conventional ZnO NW arrays, where testing is carried out using the same procedure. A ZnO NW sensor was fabricated from ZnO NW arrays grown on Au/Si substrate, using a seedless hydrothermal synthesis procedure [39, 40]. The ZnO sensor is compared to the BaTiO$_3$ sensor with the same electrode configuration with a thin solder foil as the top electrode but with the Au layer on a Si substrate acting as the bottom electrode. The ZnO sensor loaded with the same proof mass as the loaded BaTiO$_3$ sensor excited with white Gaussian noise to characterize the FRF displays a resonant magnitude peak at 500 Hz associated with the 90° phase shift (FIG. 7a,b). The coherence function determined to be unity from 100 to 800 Hz is observed to drop below unity owing to weak piezoelectric voltage response at frequencies above 800 Hz, as shown in FIG. 7c. The RMS sensitivity calculated from 1 g amplitude sinusoidal acceleration input at frequencies ranging from 100 to 1,000 Hz agrees well with the FRF magnitude as shown in FIG. 7d. The mean sensitivity in the ±3 dB flat region that spanned up to 350 Hz was equivalent to ~2.54 mVg$^{-1}$. Vpp from the ZnO sensor is only ~3.8 mV, with a maximum Vpp of ~22 mV at the resonant frequency of 500 Hz as shown in FIG. 7e,g with corresponding detailed shape in FIG. 7f,h, respectively. The measured ±3 dB flat band sensitivity from ZnO sensor of ~2.54 mVg$^{-1}$ is lower than the flat band sensitivity recorded from the novel BaTiO$_3$ sensor of ~50 mVg$^{-1}$, thus demonstrating the superior sensing performance of the ultra-long BaTiO$_3$ NW arrays, as shown clearly in the magnitude comparison plot of FRF with frequency axis in a log scale (FIG. 7i).

According to an embodiment of the invention, aligned BaTiO$_3$ NW arrays as vertically aligned BaTiO$_3$ nanowire (NW) arrays are formed directly on a conductive fluorine doped tin oxide (FTO) glass with a NW lengths of ~1 μm and an aspect ratio of ~12. The aligned array formed by these nanowires exhibit higher strains when compared to the bulk BaTiO$_3$ and the aligned 1 μm BaTiO$_3$ NW arrays display enhanced piezoelectric energy conversion capabilities [20, 21]. The 1 μm BaTiO$_3$ NW arrays have superior power harvesting performance over conventional ZnO NW arrays which can be driven by local variations in acceleration from a vibrating source. The NEMS energy harvester has resonance below 1 kHz for efficient energy harvesting of ambient mechanical vibrations, which typically reside in the 1 Hz to 1 kHz range. High performance NEMS energy harvesters using aligned arrays of BaTiO$_3$ NWs that efficiently harvest mechanical vibrations when integrated with a suitable low frequency resonating structure are achieved.

Figure 8:
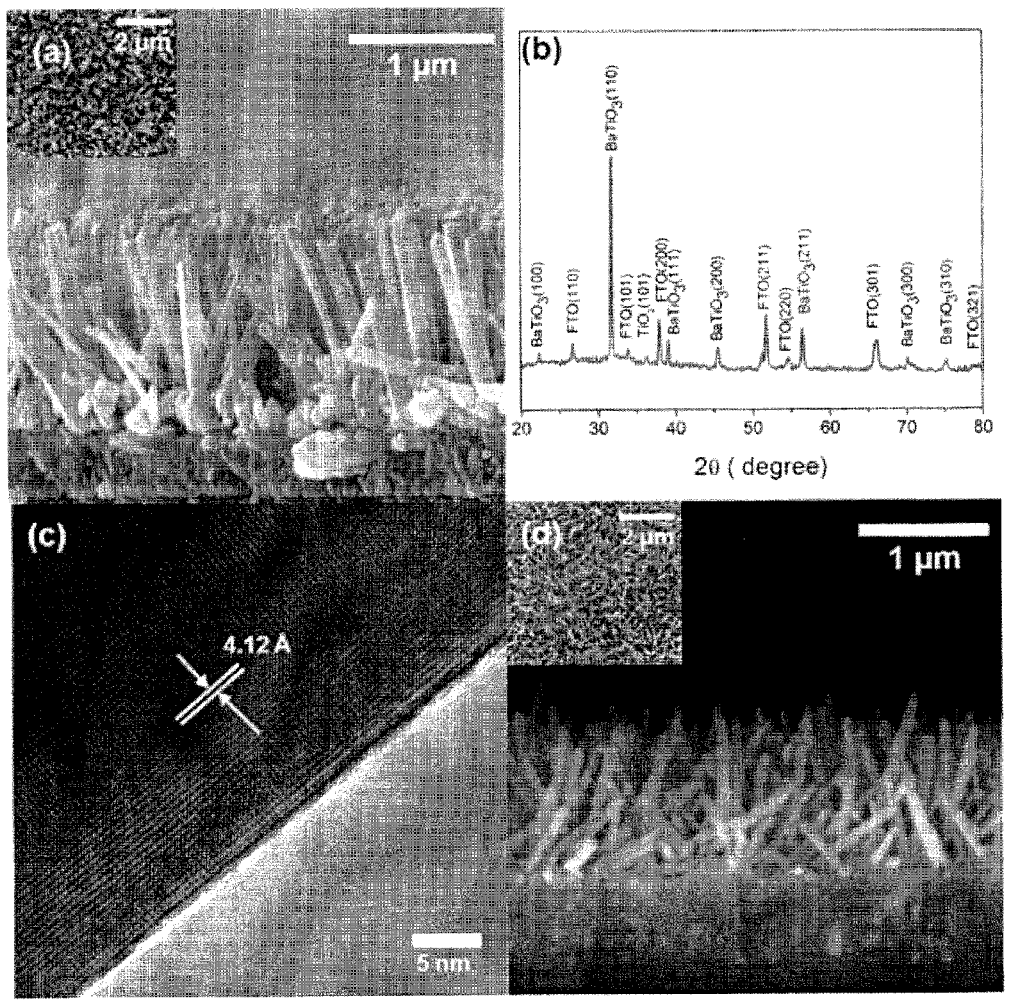
FIG. 8. Characterization of piezoelectric nanowires: (a) Cross-sectional SEM image of BaTiO3 NW arrays with the inset showing the top view; (b) X-ray diffraction spectrum from BaTiO3 NW arrays showing the majority of peaks to be $BaTiO_3$ (JCPDS No. 5-0626); (c) HRTEM image of the $BaTiO_3$ nanowire showing the clear crystal lattice fringes of single crystal structure; and (d) Cross-sectional SEM image of ZnO NW arrays with the inset showing the top view.

Vertically aligned BaTiO$_3$ NW arrays are grown directly on conductive FTO glass substrates using a two-step hydrothermal process. BaTiO$_3$ NW arrays are synthesized by reaction between Ba$^{2+}$ ions in solution with precursor single crystal vertically aligned titanium dioxide (TiO$_2$) NW arrays. X-ray diffraction (XRD) analysis of precursor TiO$_2$ NW arrays on FTO glass used for conversion to BaTiO$_3$ is observed to match a rutile phase. For example, BaTiO$_3$ NWs having a length of ~1 μm and a diameter of ~90 nm are formed by the ion exchange reaction with preservation of the morphology of precursor TiO$_2$ NW arrays. A detailed analysis of the microstructure of the aligned array of NWs by scanning electron microscope (SEM) is shown in FIG. 8a. The crystallographic structure of the nanowires by X-ray diffraction (XRD) and the XRD pattern in FIG. 8b shows that the NWs are BaTiO$_3$ (JCPDS No. 5-0626). A high resolution transmission electron microscopy (HRTEM) image of the as prepared single crystalline BaTiO$_3$ NWs with clear crystal lattice fringes is shown in FIG. 8c. For power harvesting performance comparison, aligned ZnO NW arrays with a length of ~1 μm and diameter of ~100 nm were grown on a conductive FTO glass using a low temperature solution-growth approach as shown in the SEM image in FIG. 8d [41, 42]. Both the BaTiO$_3$ NW arrays and ZnO NW arrays grown on conductive FTO glass were sputter coated with 1 nm gold (Au) layer on the top surface prior to applying them as NEMS energy harvesters.

The exemplary BaTiO$_3$ based NEMS energy harvester has a strip of indium foil bonded to the non-conductive edge of the FTO glass substrate that is formed as a beam to make contact with the top of the as-synthesized vertically aligned BaTiO$_3$ NW arrays where the indium foil serves as the top electrode to the conductive FTO glass bottom electrode. This configuration allows the NEMS energy harvesting device to achieve a low resonant frequency by capitalizing upon the beam's resonance rather than the NW's resonance. A ZnO NW NEMS energy harvester fabrication was formed to use the indium beam technique to contact the ZnO NW arrays grown on FTO glass, as shown in the schematic of the configuration in FIG. 9a. An Au layer (work function of ~5.1-5.47 eV) sputter coated on as-synthesized ZnO nanowires (electron affinity of ~4.1-4.3 eV) prior to device fabrication helped to form a Schottky barrier between indium (top electrode) and ZnO NW arrays [9]. It is important to form a Schottky barrier to efficiently extract piezoelectric charge from the nanowire's tip and to block electron flow through the interface from the metal side to the semiconducting nanowires side. The surface area of the indium top electrode has a dimension of ~5×4 mm$^2$ in the ZnO NW and BaTiO$_3$ NW NEMS energy harvesters to permit power density comparison. The BaTiO$_3$ based NEMS energy harvester is poled with high DC electric field (~120 kV/cm) for 24 hours to ensure the dipoles of the single crystal BaTiO$_3$ NWs align in the electric field direction normal to the plane of the two electrodes and oriented with the NWs [43]. High voltage poling between the two electrodes is essential for piezoelectric function of ferroelectric BaTiO$_3$ NW arrays, but is not required for ZnO NW arrays as they possess intrinsic spontaneous polarization. The exemplary NW energy harvesters were excited through base vibration generated by a permanent magnet shaker while the input base acceleration was accurately measured using a reference shear accelerometer (PCB 352C22).

Figure 9:
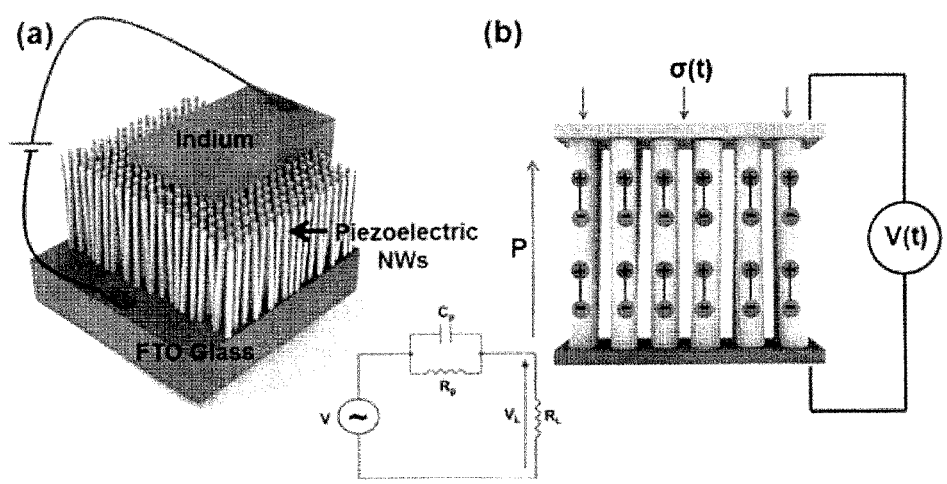
FIG. 9. NEMS energy harvester configuration and characterization: (a) schematic diagram of NEMS energy harvester fabricated using piezoelectric NWs array; and (b) Schematic of voltage generation from piezoelectric NEMS Energy Harvester (P denotes the polarization direction, σ denotes the stress and V is the piezo-voltage generated by the nanowires) with the inset at the bottom showing the electrical circuit representation of piezoelectric energy harvester with the voltage (VL) measured across the load resistor (RL) to characterize AC power delivered to the load (Cp denotes capacitance of source and Rp is the leakage resistance).

Compressive and tensile stress generated from the inertial force of the vibrating indium beam on the BaTiO$_3$ and ZnO NW arrays result in charge generation from the direct piezoelectric effect, which develops an alternating potential difference across the two electrodes, as shown schematically in FIG. 9b. This is the working principle of vibration-driven NEMS energy harvesters. The electrical equivalent circuit for the NEMS energy harvester is shown as an inset in FIG. 9 where the piezoelectric voltage, V, is induced from the vibration acceleration in series with the inherent capacitance of the source, $C_p$, and piezoelectric leakage resistance, $R_p$, connected in parallel. The voltage, VL, is measured across the load resistor, RL, to calculate the AC power dissipation. Here, the piezoelectric leakage resistance, $R_p = X_C^2/R_S$, is not taken into account as it is normally two orders of magnitude higher than the impedance (ZS) of the source capacitance (in pF range) where RS is the series resistance and $X_C = 1/j\omega Cp$ is the reactance of the capacitor. As a result, the effect of leakage resistance on the overall impedance is negligible. The source capacitance (Cp), which is the capacitance measured between the two electrodes of the exemplary NEMS energy harvesters, was performed using an Agilent E4980A 5 LCR meter. The impedance measurements showing the series resistance (RS) and the reactance (XC=1/jωCp) of the exemplary BaTiO$_3$ NEMS energy harvester and ZnO NEMS energy 10 harvester were performed. The impedance contributed by the capacitance ($Z_S = 1/(\omega_n C_p)$) of the piezoelectric NWs at resonant frequency, $\omega_n$, is matched using purely resistive loads to determine the AC power [44].

All measurements on exemplary devices were performed inside a grounded faraday cage to reduce the effects of extrinsic power-line noise (60 Hz harmonic noise) on the NEMS output voltage. The output voltage was measured using a high impedance (1 TΩ) voltage follower with unity gain, and the short circuit current was measured using a high speed electrometer (Keithley 6514). The dynamic response analysis of the NEMS energy harvester was performed using the frequency response function (FRF) characterization that gives the relative magnitude and phase of the ratio of the response signal from the NW arrays to the stimulus input base acceleration. Firstly, the FRF between the open circuit output voltage from the NEMS energy harvester and the input base acceleration measured by the reference shear accelerometer is examined to determine the open circuit resonant frequency when the harvester is excited with burst chirp and white Gaussian noise signals from shaker that have flat power spectral density in the test frequency range of up to 1 kHz. The FRF between the short circuit current from the NW arrays and the input base acceleration was characterized using burst chirp and white noise excitation. Piezoelectric open circuit voltage (VOC) and short circuit current (NC) is at the maximum at the resonant frequency, which corresponds to the frequency where the indium beam generates maximum strain on the NW arrays of the NEMS energy harvester. At the resonant frequency, root mean square (RMS) voltage (VL) measured across the external resistive load (RL) can be used to determine the AC power (PL) experimentally from the NEMS energy harvester as shown in the Eqn. 1 [45] Peak AC power is dissipated when the external resistive load (RL) is matched with the source impedance (ZS) as per maximum power transfer theorem.

$$P_L = I_{L(RMS)}^2 R_L = \left\{\frac{V_{(RMS)}}{Z_S + R_L}\right\}^2 R_L = \frac{V_{L(RMS)}^2}{R_L} \tag{1}$$

Figure 10:
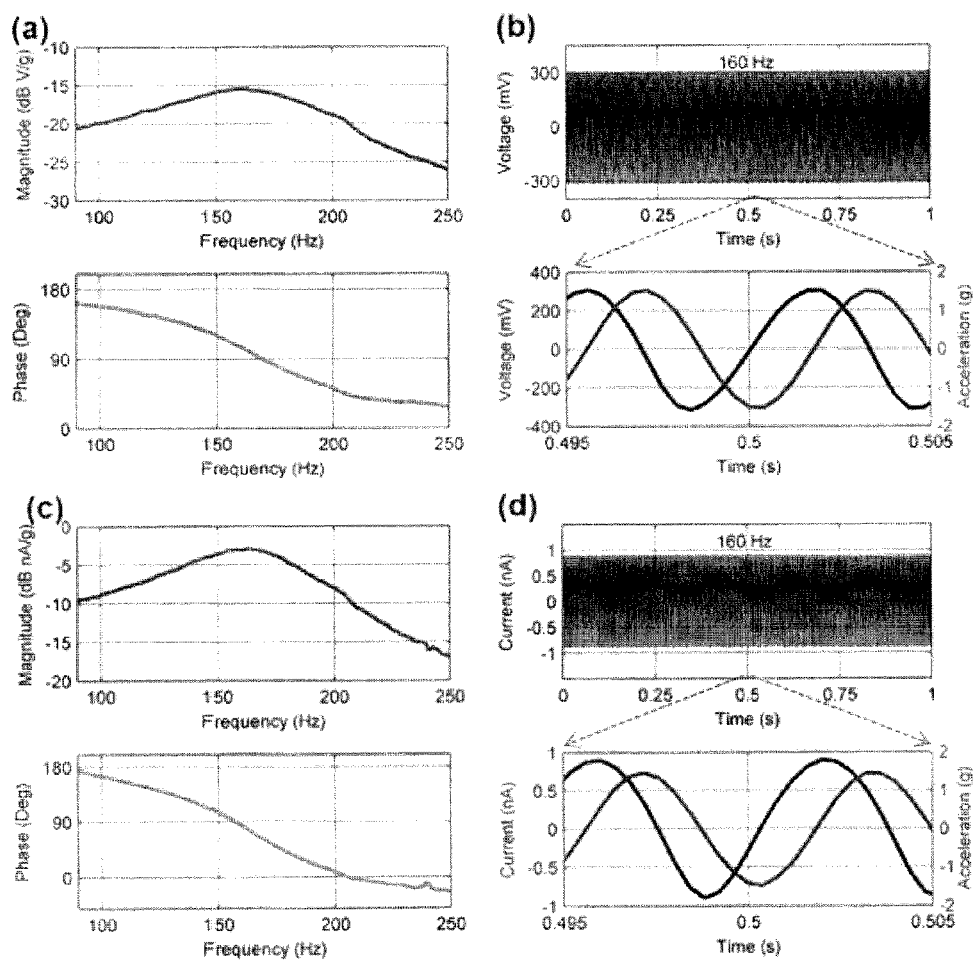
FIG. 10. Open circuit voltage and Short circuit current analysis from $BaTiO_3$ NW NEMS Energy Harvester: (a) open circuit voltage (VOC) FRF showing the resonant peak at ~160 Hz associated with 90° phase shift; (b) VOC from 1 g RMS sinusoidal acceleration input near resonant frequency (~160 Hz) shown in the top panel with the bottom panel showing the detailed shape of voltage and input base acceleration; (c) Short Circuit Current (ISC) FRF with a resonant peak near ~160 Hz; and (d) ISC from 1 g RMS acceleration input near resonant frequency shown in the top panel with the bottom panel showing the detailed shape of current and input acceleration.

The capacitance of the exemplary BaTiO$_3$ NW energy harvester measured by the LCR meter is 8.21 pF at 1 kHz. The open circuit voltage VOC FRF characterized from burst chirp voltage response after poling produced a resonant peak at ~160 Hz, as shown in FIG. 10a. The sinusoidal excitation at resonant frequency yielded a high peak to peak voltage Vpp of ~623 mV from 1 g RMS base acceleration input as shown in FIG. 10b. The high voltage response is due to the high dynamic strain on the NW arrays from the beam at resonance inducing an alternating piezoelectric charge accumulation at the two electrodes. It is well known that when measuring the open circuit voltage with a voltage buffer amplifier with high input impedance (1 TΩ), the current is at its minimum (theoretically zero) so the AC power is virtually zero.

The short circuit current (ISC) FRF from the exemplary BaTiO$_3$ NW NEMS energy harvester was characterized by using burst chirp excitation input with ISC magnitude peak at resonant frequency of ~160 Hz associated with a 90° phase change, as shown in FIG. 10c. The ISC response to chirp input was recorded. High ISC from the NW arrays were observed by exciting with a sine wave at resonant frequency (~160 Hz) with a peak to peak current (Ipp) of ~1.8 nA recorded from base acceleration input of 1 g RMS (FIG. 10d). High ISC is directly proportional to the piezoelectric charge production from the poled ferroelectric BaTiO$_3$ NW arrays when increased strain is applied by the resonating indium beam structure. In short circuit electrical boundary conditions, voltage is theoretically zero and the AC power is zero.

Figure 11:
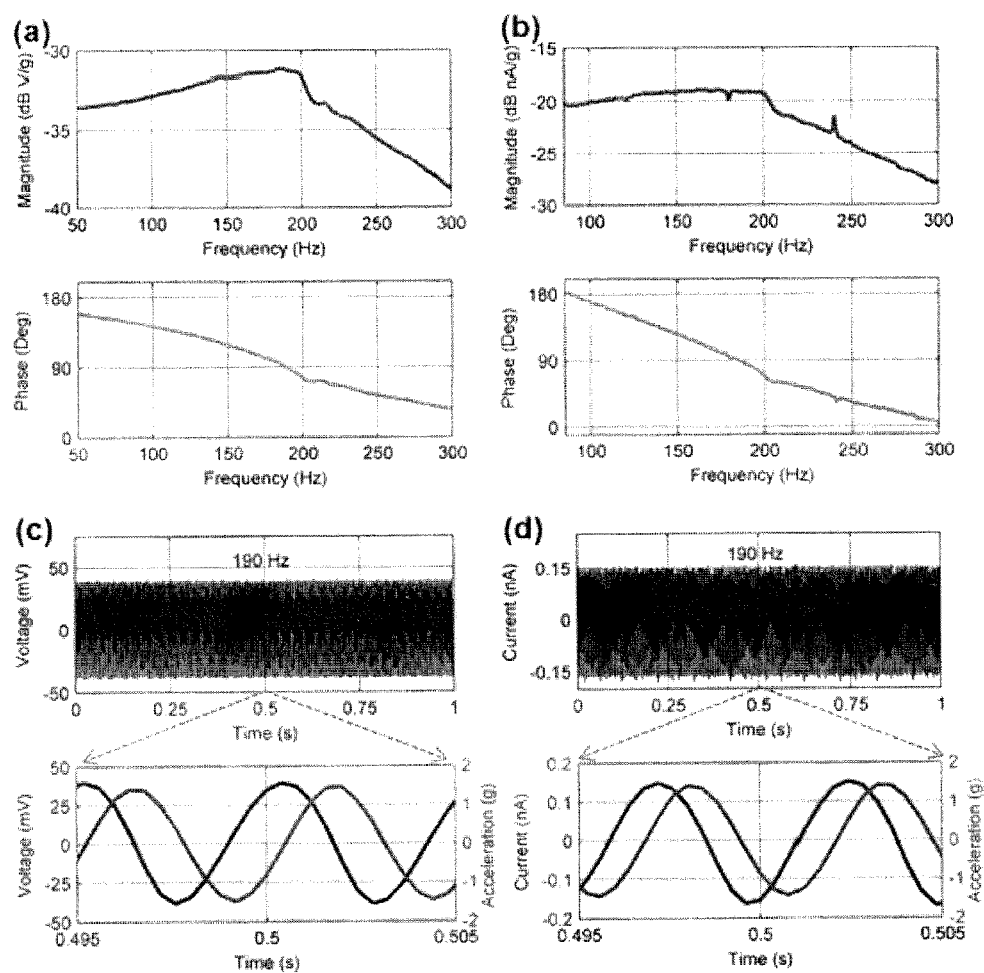
FIG. 11. Open circuit voltage and short circuit current analysis from ZnO NW NEMS energy harvester: (a) open circuit voltage (VOC) FRF showing the resonant peak near ~190 Hz associated with 90° phase shift; (b) Short circuit current (ISC) FRF with resonance peak near ~190 Hz; (c) VOC measured near resonance from 1 g RMS acceleration shown in the top panel with the bottom panel showing the detailed shape of voltage and acceleration; and (d) ISC from 1 g RMS acceleration input near resonant frequency shown in the top panel with the bottom panel showing the detailed shape of current and acceleration.

Capacitance of a comparable ZnO NW NEMS energy harvester was measured by the LCR meter to be 8.72 pF at 1 kHz. A direct vibration excitation experiment was carried out on the as fabricated ZnO based NEMS energy harvester to investigate its performance compared with the $BaTiO_3$ NW NEMS energy harvester. The VOC FRF and ISC FRF of the ZnO NW energy harvester were analyzed by triggering white noise and burst chirp excitation with a resonant magnitude peak observed at ~190 Hz as shown in FIG. 11a-b. The ZnO NW NEMS energy harvester's peak to peak open circuit voltage Vpp and peak to peak short circuit current Ipp from sine wave excitation at resonance were measured 5 to be ~85 mV and ~0.316 nA from the 1 g RMS input acceleration as shown in FIG. 11c-d. The voltage and current levels produced by the ZnO NW NEMS energy harvester are much lower than the $BaTiO_3$ NW NEMS energy harvester due to ZnO's lower coupling coefficient.

Figure 12:
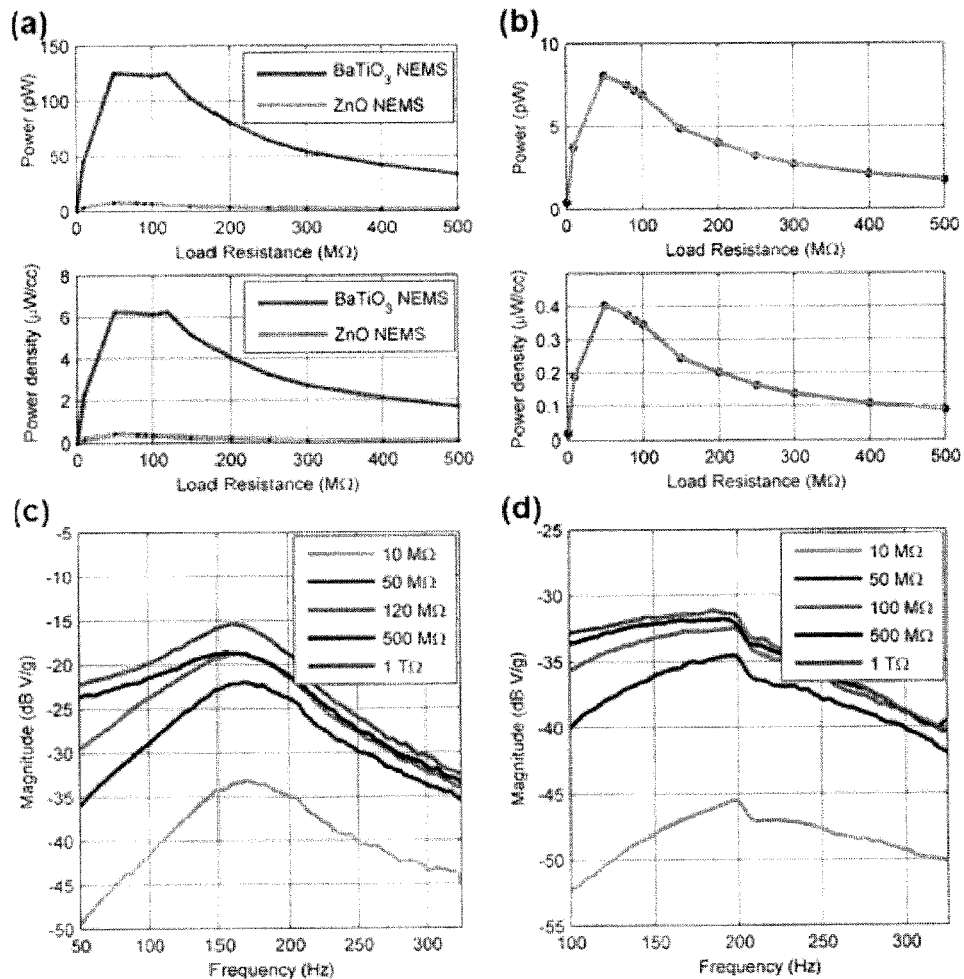
FIG. 12. Power characterization of NEMS energy harvesters: (a) AC Power and Power Density of $BaTiO_3$ NW NEMS energy harvester with varying load resistor (RL) showing peak power of ~125.5 pW and peak power density of ~6.27 μW/cc at optimal RL of 120 MΩ from 1 g RMS acceleration; (b) AC Power and Power density of ZnO NW NEMS energy harvester with varying load resistor (RL) showing a lower peak power of ~8 pW and peak power density of ~0.4 μW/cc at optimal RL of 50 Ma from 1 g RMS sinusoidal base acceleration; (c) Voltage Magnitude of FRF from $BaTiO_3$ NW NEMS Energy Harvester measured for various load resistors shows increasing magnitude peak as load resistance increases; and (d) Voltage Magnitude of FRF from ZnO NW NEMS Energy Harvester measured for various load resistors shows increasing magnitude peak as load resistance increases with the maximum peak from VOC FRF (1 TΩ).

The AC power from the energy harvester is calculated by measuring the voltage, VL, across several load resistors, RL, ranging from 1 MΩ to 500 MΩ. The source impedance, ZS, of $BaTiO_3$ NW arrays with capacitance of ~8.21 pF at natural frequency ($\omega n=2*\pi*fn$ where fn=~160 Hz) was evaluated to be ~121 MΩ. The AC power from $BaTiO_3$ NW NEMS energy harvester increased rapidly as RL increases up to 50 MΩ reaching a uniform peak value of ~125.5 pW at the optimal RL of 120 MΩ and then reduces as RL is traced up to 500 MΩ since voltage across the increasing load resistors starts saturating towards the VOC. The peak power density across the optimal RL was calculated for the exemplary $BaTiO_3$ NW NEMS energy harvester to be ~6.27 μW/cc from 1 g RMS base acceleration (FIG. 12a). For the comparative ZnO NW NEMS energy harvester, the source impedance, ZS, at resonant frequency ($\omega n=2*\pi*fn$ where fn=~190 Hz) was measured to be ~96 MΩ and the peak AC power dissipated across the optimal RL of 50 MΩ is only ~8 pW from the same input base acceleration of 1 g RMS. The peak power density from the ZnO based NEMS energy harvester was calculated to be ~0.4 μW/cc as shown clearly in FIG. 12b. This power density for the $BaTiO_3$ NW NEMS energy harvester is ~16 times lower than the peak power density (~6.27 μW/cc) recorded from $BaTiO_3$ based NEMS energy harvester driven with the same base acceleration of 1 g RMS and, hence, illustrates the superior vibrational energy harvesting performance from $BaTiO_3$ NW arrays. The voltage magnitude of the FRF from the exemplary $BaTiO_3$ NEMS was characterized across several load resistors and the magnitude peak at resonant frequency was found to increase with the increase in the load resistors with the maximum peak being that of the open circuit voltage FRF (1 TΩ) as shown in FIG. 12c. Moreover, the magnitude of the voltage FRF from the comparative ZnO NEMS was characterized across several load resistors (RL) to demonstrate the similar increase in magnitude with the highest peak at resonance from the VOC FRF (FIG. 10d). The voltage VL across the optimal RL with RMS value of ~123 mV provides the maximum peak power density from $BaTiO_3$ energy harvester. For the comparative ZnO NEMS, the voltage 5 VL across optimal RL has a RMS value of ~20.2 mV to provide the lower peak power density as compared to the exemplary $BaTiO_3$ NEMS from the same base acceleration input. In addition, a switching polarity test was performed that confirms that the measured signal responses from the NEMS energy harvester were generated by the nanowires. The power density observed for the exemplary $BaTiO_3$ NEMS energy harvester (~6.27 μW/cc) is comparable to several meso-scale and MEMS-scale resonant cantilever based energy harvesters driven by base vibration. {44-46}

Figure 13:
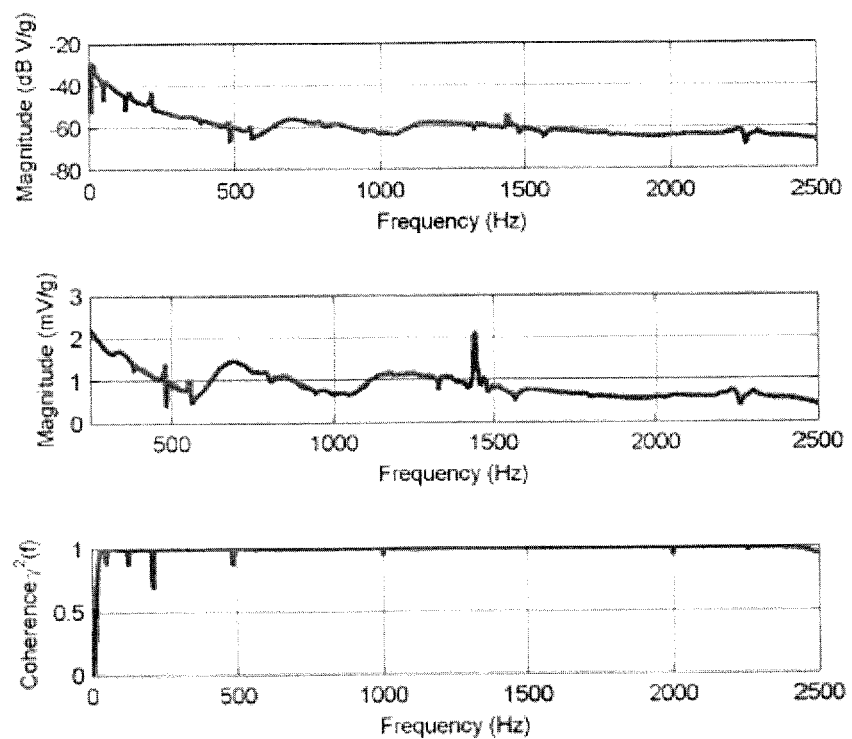
FIG. 13. Frequency Response Function and Coherence Function for $BaTiO_3$ Sensor with melted Indium as top electrode.

An exemplary $BaTiO_3$ NWs sensor with a melted Indium top electrode outputs piezo-potential when subjected to vibration due to stress induced on the $BaTiO_3$ NWs arrays from the mass of the top electrode. The exemplary $BaTiO_3$ NWs sensor was excited with white Gaussian noise to characterize its frequency response. A Hanning window was used to reduce the power leakage at frequencies adjacent to the correct frequencies. The reference accelerometer measured the input white noise acceleration imposed on the exemplary $BaTiO_3$ NWs sensor and, since the piezoelectric phenomenon is linear when subjected to stress levels below threshold, the output voltage from the exemplary $BaTiO_3$ NWs sensor was observed as white noise. A frequency response function(FRF) of the exemplary $BaTiO_3$ NWs sensor shows higher voltage generating performance at low frequencies in terms of the input acceleration followed by a flat band region from 500 Hz to 2500 Hz where the mean is 880 μV/gas shown in FIG. 13. The ordinary coherence function between the input acceleration measured from the accelerometer and the output voltage from the $BaTiO_3$ NWs sensor is very strong, reaching unity over a wide frequency range. The coherence plot validated an excellent linear relationship of the sensor with minimal spectral leakage. The initial loss in coherence at frequencies below 10 Hz is due to the contributions to the output voltage from the inputs other than the measured input acceleration from the reference accelerometer. This coherence loss is also due to extraneous noise present in the input acceleration measurement at low frequencies, as shown in FIG. 13.

Figure 14:
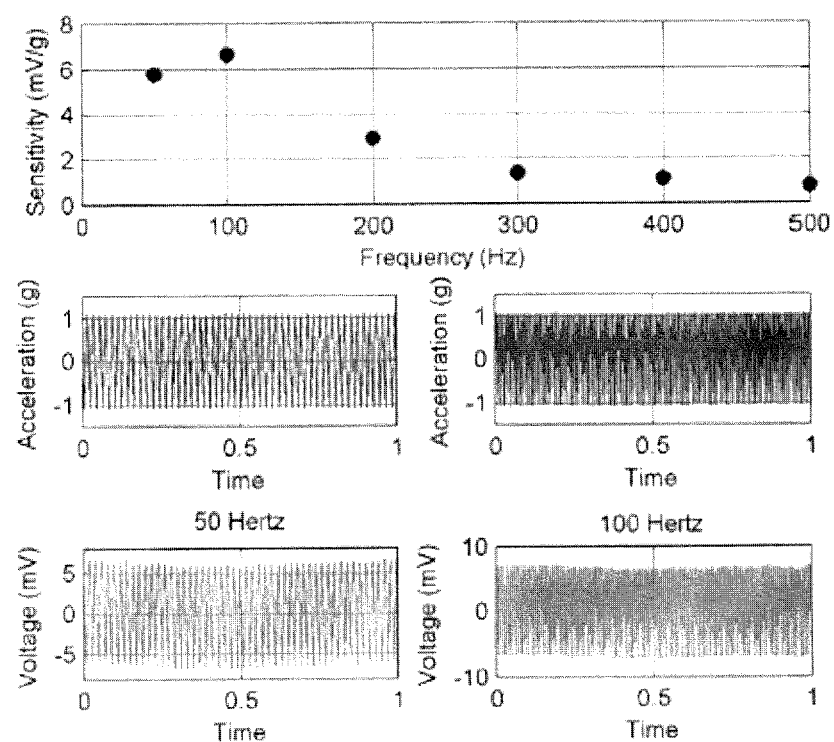
FIG. 14. Sensitivity in term of acceleration at low frequencies from 1 g amplitude sine wave excitation for $BaTiO_3$ Sensor with melted Indium as top electrode.

Sine wave excitation of the $BaTiO_3$ NWs sensor at low frequencies, below 200 hz, resulted in high sensitivity in terms of acceleration with the sensitivity at 100 Hz being the highest at 6.67 mV/g, as shown in FIG. 14. The reason for this higher sensitivity at low frequencies is attributed to better contact between the melted Indium top electrode and the array of vertically aligned $BaTiO_3$ NWs resulting in higher voltage generation with 1 g amplitude acceleration.

Frequency preservation was observed from sine wave excitation over a wide frequency range from the exemplary $BaTiO_3$ NWs sensor, which illustrates the excellent performance characteristic of the $BaTiO_3$ NWs sensor. High sensitivities obtained at low frequencies from the exemplary $BaTiO_3$ NWs sensor permits enhance voltage generation for energy harvesting applications due to the low frequency resonance to the $BaTiO_3$ NWs arrays.

METHODS AND MATERIALS

Figure 15:
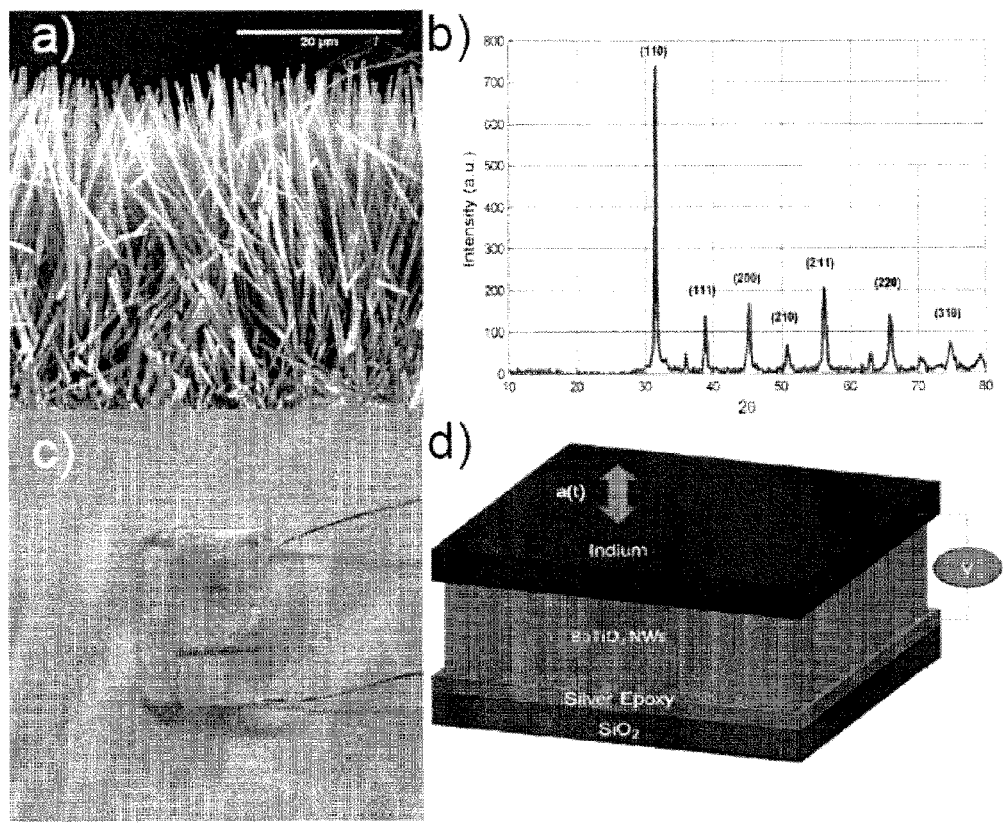
FIG. 15. Barium Titanate Nanowires Characterization and Sensor Device Fabrication: (a) Cross-sectional SEM image of $BaTiO_3$ NWs; (b) X-ray diffraction spectrum from the as grown nanowire arrays; (c) Image of the $BaTiO_3$ NWs based sensor device; and (d) Schematic diagram of the sensor device using $BaTiO_3$ NWs array.

Ultra-long aligned arrays of $BaTiO_3$ nanowires (NWs) were obtained and the detailed analysis of their structure was performed using JEOL 6335F scanning electron microscope (SEM), as shown in FIG. 15a. The ultra-long $BaTiO_3$ NWs arrays span a length of 40 μm and diameter of the individual NWs are 600 nm, respectively. The crystallographic structure of the nanowires was analyzed using the X-ray diffractometer and the XRD pattern in FIG. 15b shows the $BaTiO_3$ peaks (JCPDS No. 5-0626). Sensors were fabricated using Indium as a top electrode and silver epoxy as the bottom electrode, which sandwiched the vertically aligned array of $BaTiO_3$ NWs with $SiO_2$ transparent glass as the non-conductive substrate. The fabricated sensor image and the schematic diagram of the voltage generating $BaTiO_3$ NWs sensor are shown in FIG. 15c and FIG. 15d, respectively. Indium, as the top electrode, is a soft malleable metal with favorable properties, as shown in Table 1, below.

TABLE 1

Properties of Indium Foil

| Density g/cm3 | Melting Point ° C. | Young's Modulus GPa | Thickness Mm |
|---|---|---|---|
| 7.31 | 156.59 | 11 | 0.127 |

Two different Indium top electrode sensor configurations were fabricated to investigate the sensing and energy harvesting capability of the $BaTiO_3$ NWs arrays. In the first configuration, the $BaTiO_3$ NWs sensor was developed with melted Indium as the top electrode with an indium electrode area of 6×5 $mm^2$ and seismic mass of 18.53 mg and a $BaTiO_3$ area of 4×5 $mm^2$. The melted Indium electrode also provides the proof mass for vibration acceleration sensing, applying the stress on the vertically aligned array of NWs to generate voltage from the piezoelectric effect.

In a second configuration, the $BaTiO_3$ NWs based device was fabricated for energy harvesting applications with the Indium top electrode acting as a cantilever beam contacting the $BaTiO_3$ NWs array, whose properties are shown in Table 2. Capacitance of the sensor was measured to validate the NWs contact by the two electrodes. Additional tip mass on the cantilever beam was added to further modify the resonant frequency shift and to increase the amount of stress induced on the $BaTiO_3$ NWs for realizing enhanced voltage generation.

TABLE 2

Properties of $BaTiO_3$ Sensor with cantilever Indium beam acting as top electrode Beam Dimension = 10 × 4 $mm^2$
$BaTiO_3$ NWs area located below beam = 4 × 5 $mm^2$
Effective Mass = 0.23 * Mbeam = 8.54 mg
Stiffness 'Keff' of beam = 223.82 N/m
Natural Frequency of beam 'fn' = 223.82 Hz
Additional Tip Mass = 150 mg After completion of successful fabrication, conventional poling of the $BaTiO_3$ NWs based sensor was carried out by supplying 6.25 KV/cm DC voltage across the two electrodes of the sensor for 12 hours. High voltage poling is performed at room temperature to ensure the dipoles of the $BaTiO_3$ NWs arrays align in the electric field direction which is normal to the plane of the two electrode along the orientation of the NWs. Application of compressive stress on the vertically aligned $BaTiO_3$ NWs array results in charge generation from direct piezoelectric effect and thereby, a potential difference develops across the two electrodes.

Figure 16:
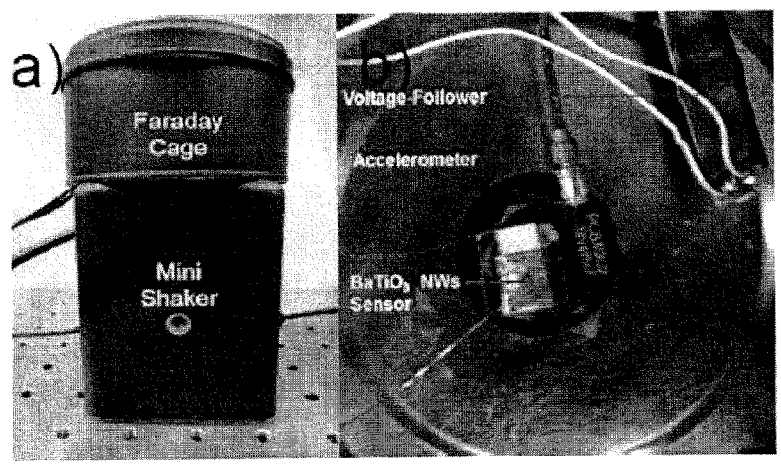
FIG. 16. Shows the: (a) experimental setup and (b) arrangement inside Faraday cage.

The experimental setup for piezoelectric $BaTiO_3$ NWs based sensor characterization is shown in FIG. 16. Acceleration input for the $BaTiO_3$ NWs based sensor was provided by a miniature electromagnetic shaker (Labworks, Inc. ET-132) driven by a power amplifier (Labworks, Inc.) from the output signal generated using a DAQ board (NI USB 4431). The $BaTiO_3$ NWs sensor was mounted on the base of the shaker beside a reference shear accelerometer (PCB 352C22) that can measure the input acceleration applied to the sensor. The capacitance of the $BaTiO_3$ NWs sensor was measured using a LCR meter (Agilent E4980A). A voltage follower/buffer amplifier with unity gain from Linear Technologies (LTC6240CS8) provided high input resistance (1 TΩ) and low noise (Voltage noise <10 nV/√Hz). To reduce leakage current during measurement from the $BaTiO_3$ NWs sensor source, which has high input impedance (low capacitance: 3.60 pF) and to counteract the effects of parasitic capacitance that would adversely affect the sensor's actual sensitivity, the voltage follower was placed in the near proximity of the sensor and connected using short low noise cable to the sensor source. The grounded faraday cage, which acts as a noise shield from EMI surrounds the sensor and voltage follower setup and improves the signal to noise ratio of the sensor, assures no extraneous noise at input and output points that affect the sensor's linear characteristics. All signals were generated and acquired through DAQ board (NI USB 4431) operated using NI SignalExpress software from PC. All signals were evaluated using an oscilloscope (Tektronix, DPO 3014 Digital Phosphor Oscilloscope).

Synthesis of Ultra Long Vertically aligned $BaTiO_3$ Nanowire Arrays

Figure 2:
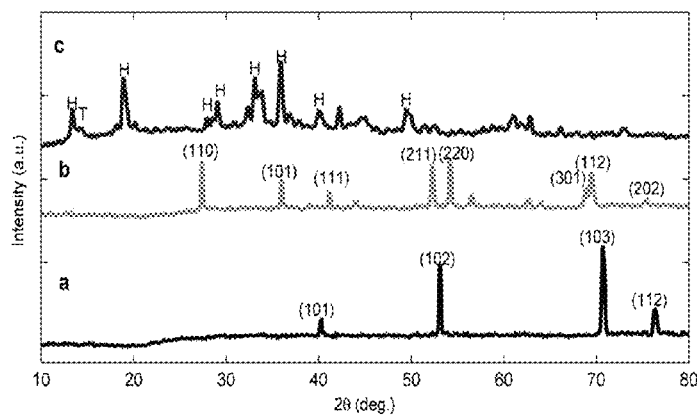
FIG. 2. Characterization of material using X-ray diffraction (XRD): (a) Starting titanium (Ti) foil used for the synthesis (JCPDS No. 65-3362); (b) Oxidized Rutile titanium dioxide ($TiO_2$) obtained after heating Ti foil at 750° C. for 8 hours (JCPDS No. 65-0191); and (c) Sodium titanate nanowire arrays used as precursors synthesized on oxidized Ti foil, H denotes the Sodium Hexatitanate ($Na_2Ti_6O_{13}$) peaks (JCPDS No. 73-1398) and T denotes the Sodium Trititanate peaks (JCPDS No. 31-1329).

The hydrothermal method for the synthesis of aligned $BaTiO_3$ nanowire (NW) arrays since it is low cost, scalable and enables control over the resulting nanowire morphology by tuning the reaction parameters. Hydrothermally a synthesis began with providing ultra-long (~45 μm) vertically aligned single crystal sodium titanate NW array on an oxidized Ti foil and using that array as precursor for conversion to $BaTiO_3$ NWs while preserving the NW form. The Ti foil (MTI Corporation; 99.9%, 100 mm thick) was cleaned via sonication for 30 min in a bath with acetone, 2-proponal and deionized water (1:1:1) solution. It was then oxidized in a furnace at 750° C. for 8 h. The resulting oxidized substrate was immersed in a Teflon-lined autoclave filled with 37.5 ml of 12M NaOH solution (Fill Factor: 50%, 97% Alfa Aesar) and sealed in a high-pressure reactor. The reactor was placed in an oven at 210° C. for 8 h to result in the controlled growth of the sodium titanate NW arrays. After cooling the reactor, the resulting structure was washed four times using deionized water and ethanol, and allowed to dry at room temperature. The sodium titanate nanostructures have strong ion-exchange properties due to an open structure with titanium octahedra ($TiO_6$) units. Reaction parameters for the synthesis of sodium titanate NW arrays were optimized to obtain nanowires that displayed a sufficient aspect ratio (~75) yet does not wick together from capillary forces during drying. The single crystal sodium titanate NW arrays were converted to $BaTiO_3$ NW arrays using a second hydrothermal reaction with aqueous barium hydroxide solution in a high pressure reactor at temperatures between 150-250° C. The dried substrate with a sodium titanate NW array was immersed in a Teflon-lined autoclave containing a solution form from barium hydroxide octahydrate ($Ba(OH)_2$ $8H_2O$) (Fill Factor: 33%, Sigma-Aldrich), placed under an argon atmosphere and sealed in the reactor. During this second hydrothermal reaction, the Ba ions diffuse into sodium titanate NWs with transformation of $NaTiO_3$ NWs into $BaTiO_3$ NWs. The reactor was placed in an oven at temperatures between 150 and 250° C. After cooling, the reactor the substrate and NWs were removed from the oven, the substrate and NWs washed with dilute nitric acid, deionized water, and ethanol, and dried to yield the $BaTiO_3$ NW arrays. Step by step characterization was performed using X-ray diffraction (XRD) to identify the material's crystal structure, starting from a pure Ti foil substrate to formed sodium titanate nanowire precursors, which yielded the $BaTiO_3$ NW arrays (FIG. 2). The XRD analysis on the crystal structure of sodium titanate nanowire arrays showed a majority of the peaks that matched with sodium hexatitanate ($Na_2Ti_6O_{13}$) (JCPDS 31-1329) and some peaks from sodium trititanate ($Na_2Ti_3O_7$) (JCPDS 73-1398). The crystal structure and lattice parameters of individual nanowires were examined using high resolution transmission electron microscopy (HRTEM) where the transformation from single crystal sodium titanate NW precursor to single crystal BaTiO$_3$ NWs upon Ba$^{2+}$ ion exchange was observed Characterization of BaTiO$_3$ NW Arrays.

The morphological properties, which include the orientation, dimension and crystalline structure of the as-prepared BaTiO$_3$ NW arrays, were examined using a JEOL 6335F SEM and an XRD equipped with a curved position-sensitive detector (CPS120, Inel) with Cu Ka radiation. The crystal structure, lattice parameter and diffraction pattern of individual NWs were studied using the FEI Tecnai F30 (Philips) HRTEM that operates at 300 kV accelerating voltage provided by field-emission electron gun.

Experimental Characterization of BaTiO$_3$ NW Accelerometer

An accelerometer composed of the as-synthesized and dried ultra-long aligned BaTiO$_3$ NW arrays was fabricated by transferring the BaTiO$_3$ NW arrays to a borosilicate glass substrate and using a uniform layer of silver epoxy as the bottom electrode followed by the application of a thin film of solder (Sn60Pb40) to the nanowire array surface, which acted as the second electrode. Borosilicate glass (1 mm thick) was used as the base substrate in the fabrication of the sensor by cutting a square (1 cm$^2$) using a laser ablator (Epilog Laser). The as-synthesized and dried film of BaTiO$_3$ NW arrays (6×6 mm$^2$) was removed from the oxidized Ti foil and bonded to the borosilicate glass with a uniform thin layer of conductive silver epoxy (MG Chemicals). The silver epoxy was cured at 70° C. for 10 min to enhance the adhesion and served as the bottom electrode. A thin solder film (4×4 mm$^2$) formed the top electrode being overlaid on top of the NW arrays and heated to 150° C. to improve the bonding with the NWs' top surface. Signal wires were attached to the bottom and top electrode using silver epoxy. After fabrication, the capacitance ($C_p$) of the NW sensor was measured to be 2.94 pF using a precision LCR meter (Agilent E4980A), which validates the electrical contact made with the nanowires and the absence of resistive contact between the two electrodes. The insulation resistance ($R_p$) of the NW sensor is typically two orders of magnitude higher than the impedance of the source capacitance well into the GΩ range influencing the source time constant ($\tau = R_p * C_p$). The high insulation resistance ($R_p$) reduces the low cut-off (corner) frequency limit ($f_L = 1/(2*\pi*\tau)$) of the piezoelectric NW sensor. The low cut-off frequency limit precludes the piezoelectric sensor performance for true static measurements. The sensor was poled by applying a high DC field of ~75 kVcm$^{-1}$ (320 V) to align the dipoles along the orientation of the nanowires, ensuring that any dynamic strain applied on the NW results in net charge generation. High-voltage poling was performed by maintaining strong electric field from a DC voltage supply (TREK, 677A Supply/Amplifier) across the signal wires of NW accelerometer for 12 h. The poling process establishes the direction of polarization along the vertical orientation of the NW arrays, and that the piezoelectric coupling property in the poled axis is responsible for the voltage response from the NW accelerometer.

TABLE 3

Properties of BaTiO$_3$ Sensor with Solder acting as top electrode

Solder Dimension = 4 × 4 (mm)$^2$
BaTiO$_3$ NWs area located below Solder = 6 × 6 (mm)$^2$
Seismic mass (Solder) = 16 mg

TABLE 4

Properties of ZnO Sensor with Solder acting as top electrode

Solder Dimension = 4 × 4 (mm)$^2$
Seismic mass (Solder) = 16 mg

Figure 17:
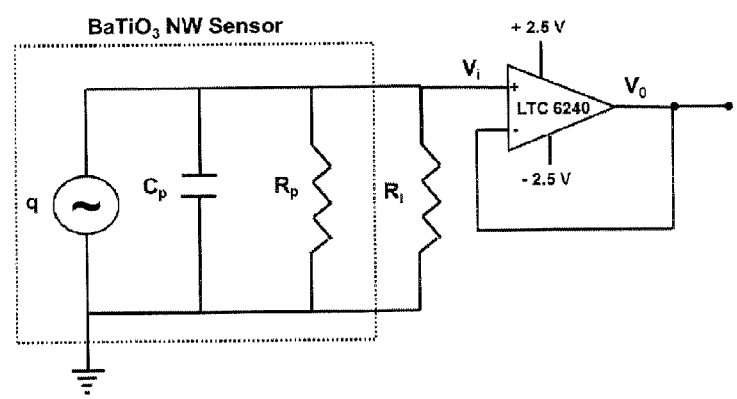
FIG. 17. Shows a schematic of the circuit representation fir a piezoelectric $BaTiO_3$ NW Sensor modeled as a charge source (q) in parallel with the source capacitance ($C_p$) and insulation resistance ($R_p$) where the high input resistance ($R_i$=1 TΩ) of the unity gain voltage follower (LTC 6240CS8) reduces the loading effect and tracks and converts the high input impedance voltage signal ($V_t$) from the sensor into a low output impedance voltage signal ($V_O$) measured using the data acquisition system (DAQ).
Figure 18:
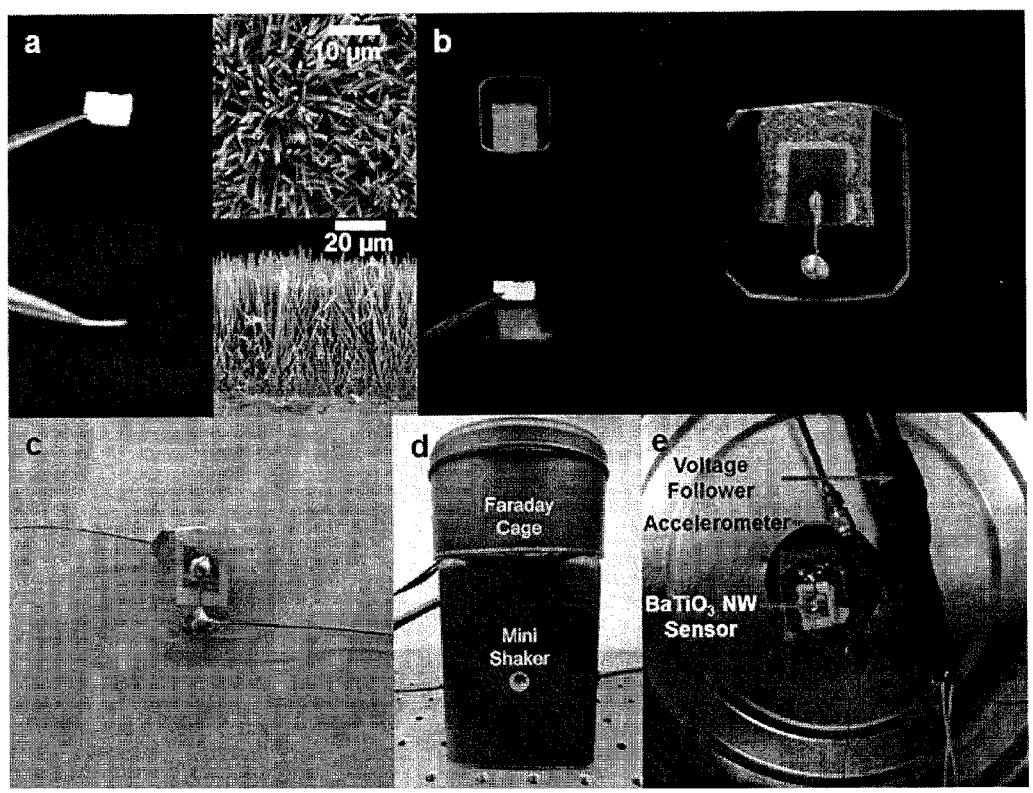
FIG. 18. Shows images of the sensor fabrication process and the test setup where: (a) $BaTiO_3$ nanowire arrays handled with tweezers with the images on the right showing the SEM of the top surface and the cross-section of the NW arrays; (b) fabrication process starting with the silver epoxy layer applied on borosilicate glass substrate (top left), followed by NW arrays placed on the silver epoxy (bottom left) and then solder film placed on top of the NW arrays and heated to enhance bonding with NWs (right); (c) $BaTiO_3$ NWs based acceleration sensing device; with (d) the experimental setup; and (e) the experimental arrangement inside Faraday cage.
Figure 19:
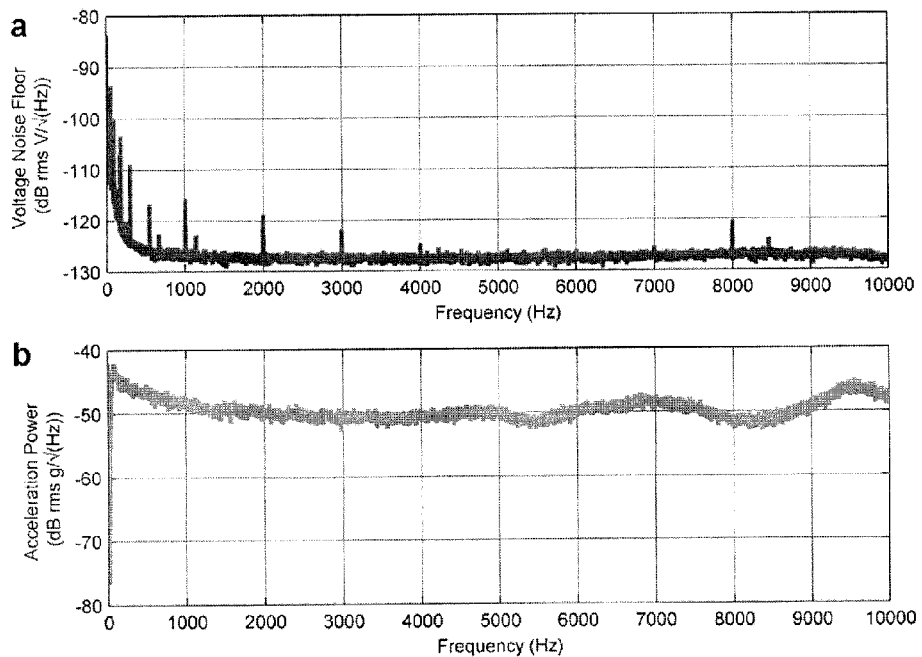
FIG. 19. Shows plots of the voltage noise floor and Acceleration spectral density where: (a) is the voltage noise floor spectral density that corresponds to a mean of 430 mV/√Hz from 500 Hz-10 kHz; and (b) is the input rms acceleration spectral applied to the sensor for FRF characterization.

A poled functional sensor was tested by inducing vibration from a miniature permanent magnet shaker and the true input acceleration supplied to the base of the sensor was measured using a shear accelerometer (PCB352C22) that has a sensitivity of 8.81 mV/g. The open circuit voltage measurements were performed using a unity gain voltage follower (LTC6240 CS8) having 1 TS2 input impedance and capacitance of 3.5 pF. The cut-off frequency is lower for the voltage follower than the NW accelerometer and, therefore, does not attenuate the piezoelectric voltage response at low frequencies. Moreover, a voltage follower was used rather than a charge amplifier to offer a wider range of working frequency without imposing a reduction in the resonant frequency since the stiffness of the piezoelectric material is maximum when the electrical boundary conditions are open (FIG. 17). Output voltage from the voltage follower is susceptible to cable capacitance, which may adversely affect the sensor's actual sensitivity. Therefore, the sensor is connected to the voltage follower using short low noise cables with a grounded faraday cage surrounding the entire connection setup to reduce the noise floor (FIG. 18b-c). The voltage noise floor of the sensor is estimated by the voltage spectral density acquired using NI DAQ system from the voltage follower connected to the undisturbed BaTiO$_3$ NW sensor (FIG. 19a). By considering the true base acceleration measured by the reference accelerometer as the input to the NW sensor and the open circuit voltage measured by the unity gain voltage follower as the output, the NW sensor was characterized as a nanoelectromechanical system (NEMS) accelerometer.

Performance Evaluation and Validation of the Piezoelectric BaTiO$_3$ NW Accelerometer.

Figure 20:
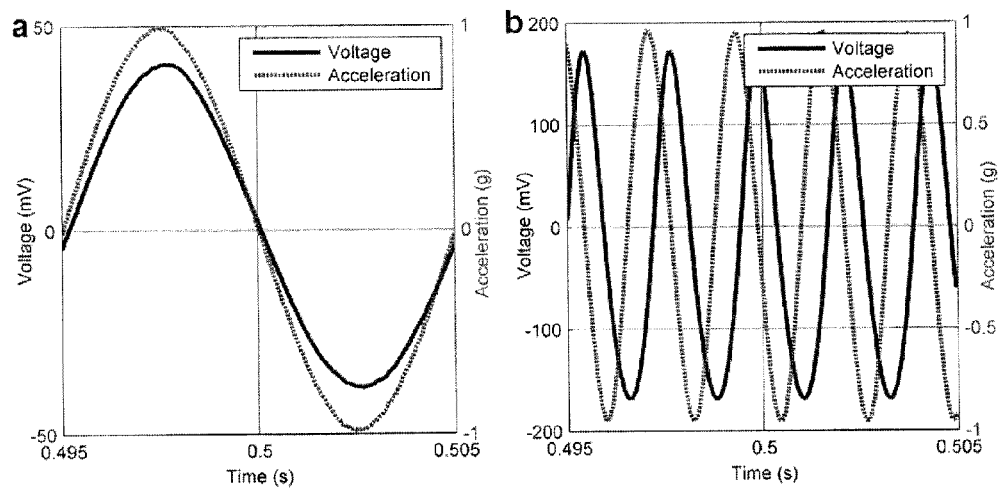
FIG. 20. Shows output piezoelectric voltage generated by NW sensor from 1 g amplitude sinusoidal acceleration input where: (a) is a detailed plot of the acceleration input and output voltage at 100 Hz; and (b) is a detailed plot showing the output voltage obtained near resonance at 450 Hz that clearly shows the 90° phase lag between the output piezoelectric voltage and the input acceleration applied to the sensor.
Figure 21:
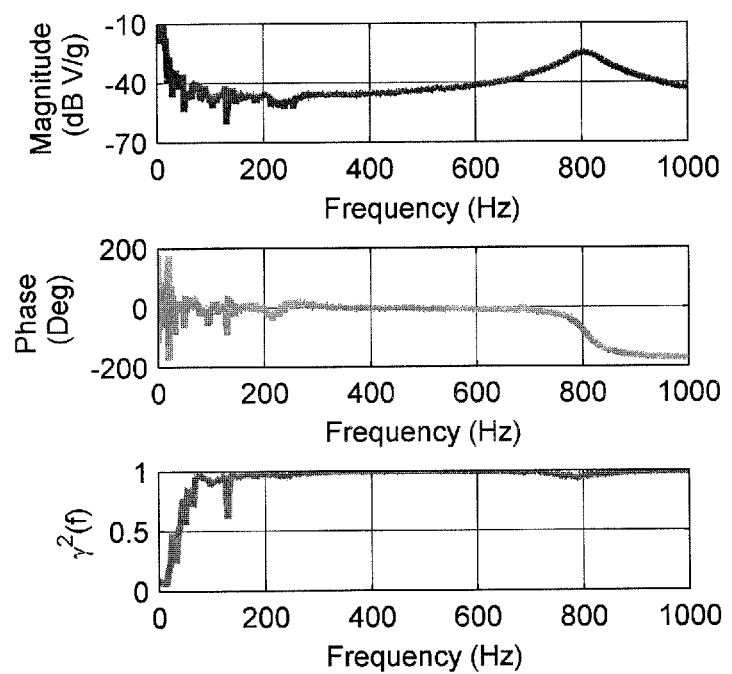
FIG. 21. Shows plots of the frequency response function (FRF) with magnitude in the top panel, phase in the middle panel, and the coherence function ($\gamma^2(f)$) in the bottom panel from $BaTiO_3$ NW sensor fabricated from annealed NW arrays at 700 C for 1 hour.

The frequency response function (FRF) and coherence function ($\gamma^2(f)$) were used to evaluate the sensitivity, linearity and operating bandwidth of the NW sensor from white noise excitation that has a flat spectral density in the frequency range of 10 kHz (FIG. S4b). 10 kHz is chosen as the test frequency range since it was the maximum operating bandwidth of the electromagnetic shaker utilized as the vibration source in the experiments. A loaded NW sensor that having an added mass on the top electrode demonstrated a resonance at 450 Hz and a high sensitivity of 50 mV/g in the 3 dB flat band region that spanned up to 300 Hz under both white noise excitation as well as sine wave excitation. Comparison of the detailed shape of the input sinusoidal acceleration of 1 g amplitude and the output piezoelectric voltage generated by the NW sensor showed an in-phase relationship at 100 Hz and a 90° out of phase relationship at 450 Hz which agrees well with the phase curve in the FRF observed from white noise excitation (FIG. 20a-b). Poled functional NEMS sensors composed of annealed BaTiO$_3$ nanowire arrays that were annealed at 700° C. for 1 hour to remove hydroxyl defects were also tested under vibration excitation but the results recorded did not show an increase in the performance of the sensor (FIG. 21).

Figure 22:
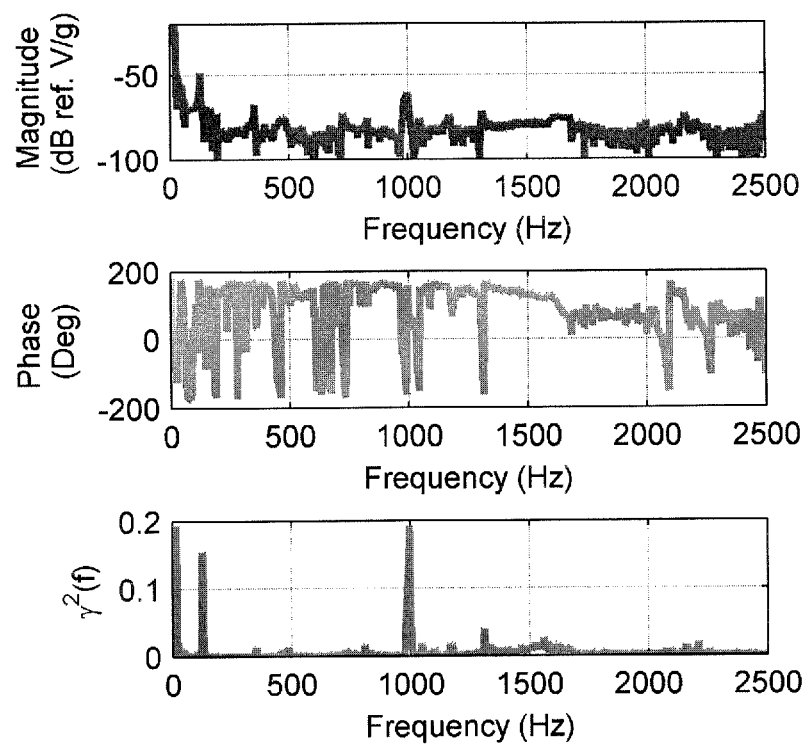
FIG. 22. Shows an analysis of de-poled NW sensor with the frequency response function (FRF) and coherence function ($\gamma^2(f)$) of $BaTiO_3$ NWs sensor under white noise excitation when heated to 150° C. for 3 hours (Curie temperature, $T_C$=120° C.) where the loss in piezoelectric behavior as the electric dipoles in the NWs have been relaxed from their oriented poled state to random directions.
Figure 23:
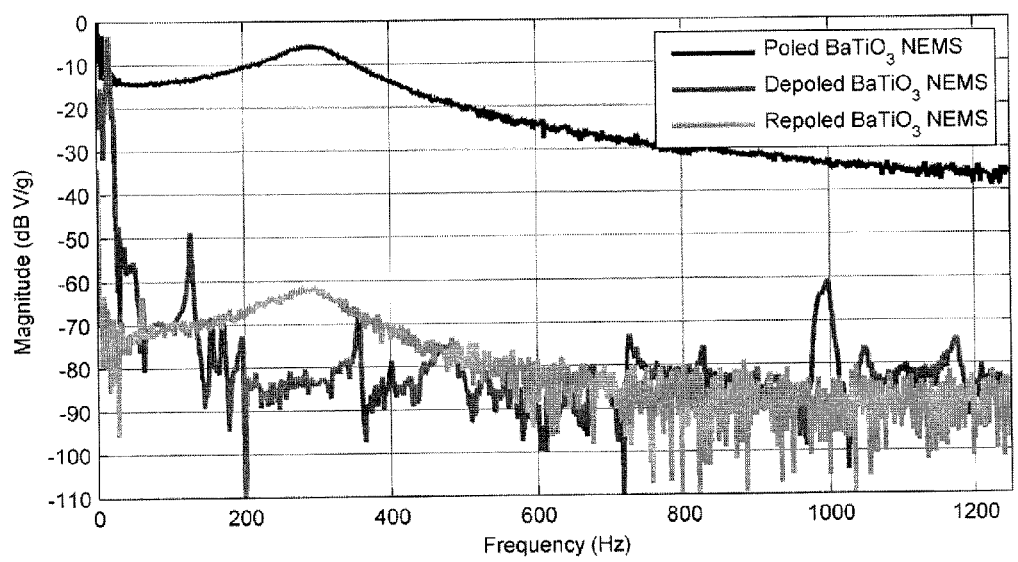
FIG. 23. Shows a composite plot of poling and depoling from the $BaTiO_3$ NW NEMS sensor where the magnitude of frequency response function (FRF) from white noise excitation from poled state by supplying DC field of 75 kV/cm for 12 hours, depoled state after heating at 150° C. for 3 hours (Curie temperature, $T_C$=120° C.) shows the loss in piezoelectric behavior as the electric dipoles in the NWs have been relaxed from their oriented poled state to random directions, and from re-poled state of poling at 75 kV/cm for 30 minutes clearly demonstrating the return of the resonant peak, which validates the piezoelectric behavior from the ferroelectric $BaTiO_3$ NW arrays.

Verification of the piezoelectric behavior from the loaded NW accelerometer with a low resonant frequency was performed by heating the accelerometer above the Curie temperature of the BaTiO$_3$ at 120° C. to relax the orientation of the electric dipoles, which eliminates the formation of a net charge on the sensor under stress. The NW sensor was tested under white noise excitation and demonstrated to produce no measureable signal with loss in coherence which confirms the transition from tetragonal phase to cubic phase of the $BaTiO_3$ nanowires on heating above Curie temperature (FIG. 22). In addition, de-poling and re-poling frequency response function analysis from the $BaTiO_3$ NW NEMS sensor was performed to validate that voltage response generated by the $BaTiO_3$ NW arrays was due to their piezoelectric behavior (FIG. 23), confirming that the piezoelectric property in the ferroelectric $BaTiO_3$ NW arrays was responsible for high sensitivity, unity coherence, and excellent linearity in a wide operating bandwidth from the NWs accelerometer that was poled before testing.

Synthesis of Aligned ZnO Nanowire Arrays.

Figure 24:
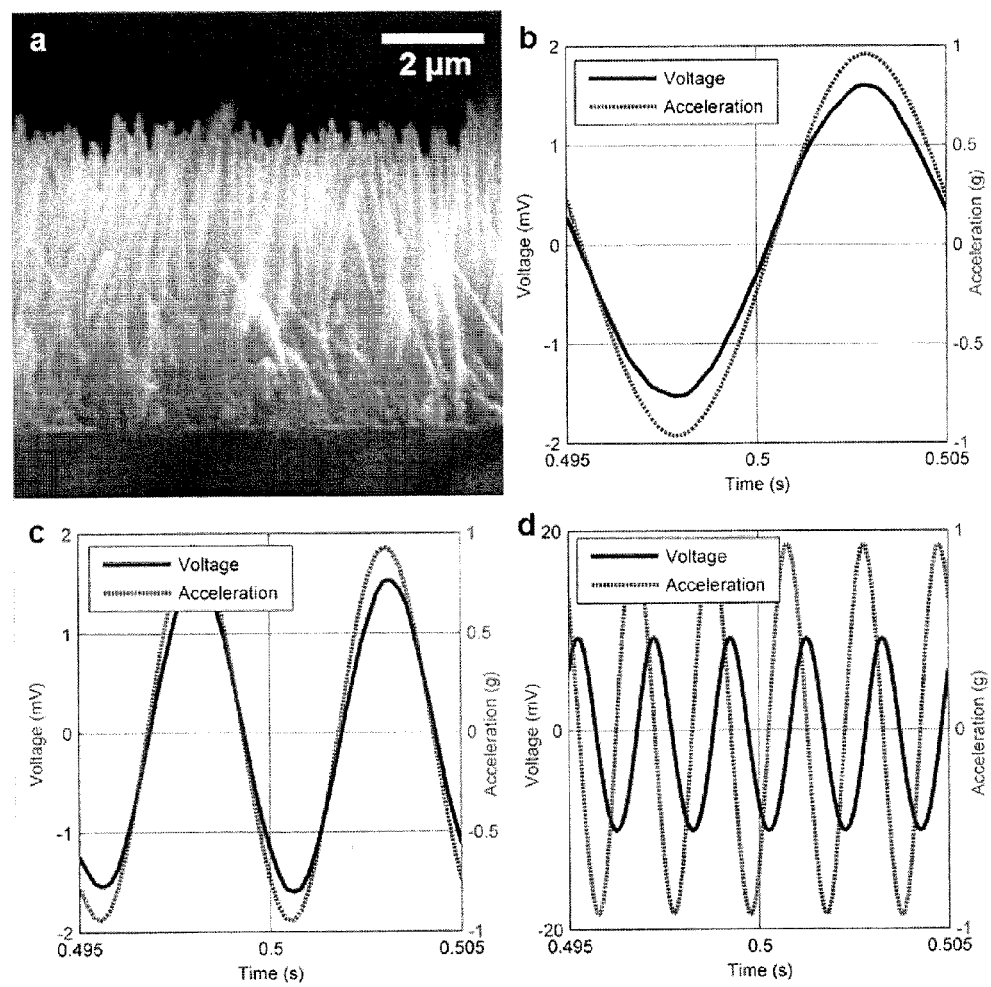
FIG. 24. Shows: (a) a cross-sectional SEM image of short ZnO NW arrays; output piezoelectric voltage generated by ZnO NW sensor from 1 g amplitude sinusoidal acceleration input for an acceleration input and output voltage at (b) 100 Hz and (c) 200 Hz showing in-phase relationship; and (d) a plot showing the output voltage obtained near resonant frequency at 500 Hz and an associated 90° phase lag between the output piezoelectric voltage and the input acceleration applied to the ZnO sensor.

ZnO NW arrays were synthesized on Au coated Si substrate (Exsil, Inc., ~500 μm thick). The Au/Si growth substrate cleaned in ethanol, isopropyl alcohol and acetone (1:1:1) solution by sonication for 10 min. The substrate was removed and rinsed in DI water for 2 min followed by drying at 100° C. for 5 min. The Si substrate with a top Au layer was annealed at 500° C. for 5 min to enhance crystallinity. A growth solution (Fill Factor: 40%) was prepared using 20 mM zinc nitrate hexahydrate ($Zn(NO_3)_2 \cdot 6H_2O$, 99%, Sigma-Aldrich) and 4% vol. ammonium hydroxide ($NH_3 \cdot H_2O$, 28-30% wt %, Ricca Chemical Company). The Au/Si substrate was placed on top of the growth solution to avoid precipitation of ZnO particles on the NW arrays. Reaction was carried out at 95° C. for 5 hours in a convection oven. The resulting substrate with ZnO NW arrays on Au surface of the Si substrate was rinsed in DI water and dried at room temperature. The hydrothermal synthesis process was repeated to enhance the length of ZnO NW arrays on Au/Si substrate. The microstructure of the ZnO nanowires were characterized using scanning electron microscopy (SEM) and a cross-sectional SEM image of aligned ZnO NW arrays is shown in FIG. 24a.

Fabrication and Performance Evaluation of Piezoelectric ZnO NW Accelerometer.

The NEMS sensor using the as-synthesized aligned ZnO NW arrays on Au/Si substrate with the similar configuration were evaluated in the manner indicated for $BaTiO_3$ NW based accelerometers with a thin solder film (4×4 $mm^2$) mounted on the NW arrays as top electrode. The Au layer on Si substrate, upon which the NW arrays were synthesized, served as the bottom electrode for the ZnO NW based NEMS sensor, avoiding any need to transfer the NW arrays to another conductive substrate. To provide sufficient insulation at the Au/Si substrate edge, a Dupont Kapton polyimide film was deposited to ensure that no resistive contact between the two electrodes occurred while attaching the signal wires. The ZnO sensor was heated to improve the bonding between solder and ZnO NW arrays. After fabrication, the capacitance of the sensor was measured to be 4.38 pF using an Agilent LCR meter, implying that there is no resistive contact between two electrodes. The performance of the loaded ZnO NW based accelerometer was evaluated under the same testing procedure used for $BaTiO_3$ sensor indicated above. The resonant frequency from ZnO NW sensor was observed near 500 Hz from FRF analysis under white noise excitation. The coherence ($\gamma^2(f)$) was observed to be unity up to 800 Hz beyond which it dropped as the voltage response got weaker. The 3 dB flat band sensitivity up to 350 Hz was evaluated to be ~2.5 mV/g and the RMS sensitivity correlates well with the FRF magnitude from 1 g amplitude sinusoidal acceleration input from 100 Hz to 1,000 Hz. The detailed plot of the acceleration and voltage showed in-phase relationship at 100 Hz and 300 Hz (FIG. 24b-c) and 90° out of phase relationship at the resonant frequency of 500 Hz (FIG. 24d) which agrees well with the phase plot in the FRF analyzed from white noise excitation.

Synthesis of Aligned Short $BaTiO_3$ NW Arrays

Synthesis of short vertically aligned $BaTiO_3$ nanowire (NW) arrays was performed on a conductive substrate using a two-step hydrothermal reaction. First, the precursor $TiO_2$ nanowire arrays were grown on conductive fluorine doped tin oxide (FTO) glass (Pilkington, TEC7 coated, 2.2 mm thick, 7Ω/sq) through an acidic hydrothermal reaction process [46]. Initially, FTO glass was cut into a square dimension (~10×10 $mm^2$) using a laser ablator (Epilog Laser) and was cleaned by sonication for 30 minutes in a 1:1:1 volume ratio solution of deionized water, acetone, and 2-propanol. After sonication, the FTO glass substrate was rinsed with methanol and water, and placed vertically inside a high pressure reactor containing 10 mL of deionized water, 10 mL of hydrochloric acid (Fisher, 37%) and 1 mL of titanium isopropoxide (Fisher, ACS). The reactor was then heated at 200° C. for 3 hours. Following the first hydrothermal process, the reactor was cooled to room temperature and the resultant FTO glass substrate with an array of vertically aligned $TiO_2$ nanowires was rinsed with deionized water and dried in ambient air. The substrates were placed into a solution containing $Ba^{2+}$ ions and converted to $BaTiO_3$ by a second hydrothermal reaction which was carried out at temperatures between 150° C. and 240° C. for 4 to 8 hours.{48-50} The $Ba^{2+}$ ions from a barium hydroxide comprising solution and temperature (150-240° C.) of the ion exchange procedure were optimized to enable shape retention of the precursor $TiO_2$ NW arrays during conversion resulting in an aligned $BaTiO_3$ NW arrays. Lastly, the samples were rinsed again with deionized water and dried in ambient air to yield $BaTiO_3$ NW arrays on a conductive FTO glass substrate. The as-synthesized $BaTiO_3$ NW arrays were heat treated at 600° C. for 30 minutes to remove any hydroxyl defects before their use as NEMS energy harvester[47, 48].

Synthesis of Aligned ZnO NW Arrays

ZnO NW arrays were synthesized on a FTO glass substrate (~10×10 $mm^2$, 2.2 mm thick) using low temperature solution growth approach for comparison to the $BaTiO_3$ NW arrays [41]. The FTO glass substrate was cleaned in an ethanol and acetone (1:1) solution by sonication for 10 min, removed, and ultrasonicated in DI water for 2 min followed by drying at 100° C. for 5 min. The conductive side of the FTO glass substrate was seeded with 2 mM zinc acetate ($Zn(O_2CCH_3)_2$, Alfa) in ethanol by dip coating and thermal decomposed at 300° C. for 20 min. The growth solution (Fill Factor: 40%) was prepared using 25 mM zinc nitrate hexahydrate ($Zn(NO_3)_2 \cdot 6H_2O$, 99%, Sigma-Aldrich), 25 mM hexamethylenetetramine (HMTA, Sigma-Aldrich) and 5-7 mM polyethylenimine (PEI, Aldrich). The FTO glass was immersed on top surface of the growth solution with the seeded conductive side facing down so that ZnO particles did not precipitate on the NW arrays. The reaction was carried out at 85° C. for 3 hours in a convection oven. The resulting substrate with the aligned ZnO NW arrays on FTO glass substrate was rinsed in DI water and dried at room temperature.

Characterization of $BaTiO_3$ NW Arrays and ZnO NW Arrays

The morphological properties which include the orientation and dimensions of the $BaTiO_3$ NW arrays and ZnO NW arrays were examined using an ultra-high resolution field-emission scanning electron microscope (FESEM) FEI Nova NanoSEM 430. The crystal structure of the as-prepared $BaTiO_3$ NWs and ZnO NWs were examined using an X-ray diffractometer (XRD) equipped with a curved position sensitive detector (CPS120, Inel) with Cu Kα radiation. The crystal structure and lattice parameter of individual BaTiO$_3$ nanowires were studied using the FEI (Philips) Tecnai F30 high resolution transmission electron microscope (HRTEM) that operates at 300 kV accelerating voltage provided by field-emission electron gun (FEG).

Fabrication of NEMS Vibrational Energy Harvester

The NEMS energy harvester using aligned BaTiO$_3$ NW arrays was fabricated by sputtering a 1 nm Au 5 layer on top of the as-prepared NW arrays grown on FTO glass substrate using a PELCO SC-7 Auto Sputter Coater. A malleable indium (Alfa-Aesar, 99.9%, 0.127 mm thick) foil was then bonded to the base of the non-conductive glass substrate and formed into a beam to make contact with the top of the NW arrays to serve as the top electrode. The Au layer (work function ~5.1-5.47 eV) that was initially coated on top of the BaTiO$_3$ NW arrays improved the contact with the indium top electrode and also assists to form a barrier to minimize leakage as reported by McCormick et al. [48]. The indium beam served as the top electrode while the conductive side of the FTO glass substrate served as the bottom electrode, with the BaTiO$_3$ NW arrays in between to form a sandwich configuration. The FTO glass substrate's edge was insulated using Kapton polyimide (Dupont) film to ensure there is no resistive electrode contact to cause shorting. The above fabricated BaTiO$_3$ NW NEMS energy harvester was poled at room temperature by supplying a high DC voltage of ~120 KV/cm (TREK 477A Supply/Amplifier) across the two electrodes for 24 hours to ensure the dipoles align in the electric field direction.

The NEMS energy harvester using ZnO NW arrays was also fabricated using a 1 nm Au layer sputtered on the as-synthesized aligned ZnO NW arrays on FTO glass substrate with the same procedure as discussed above with the indium beam to serve as the top electrode. The Au layer assists to form a Schottky barrier between the indium electrode and the semiconducting ZnO nanowires [49]. Similarly, sufficient insulation at the FTO substrate edge was needed so polyimide film was used to ensure there was no shorting between the two electrodes.

Electrical Measurement

The capacitance and impedance measurements from the NEMS energy harvesters were made using an Agilent E4980A high precision LCR meter. Mechanical vibration was generated from a Miniature Permanent Magnet shaker (Labworks, Inc. ET-132) and the voltage measurements from the NEMS energy harvester under vibration excitation was performed using a voltage follower/buffer amplifier with unity gain constructed using Linear Technologies (LTC6240CS8 CMOS Op Amp) which was chosen for its high input resistance (1 TΩ), low input bias current (0.2 pA) and low noise (Voltage noise <10 nV/√Hz).54 The short circuit current measurement from the NEMS energy harvester was performed using a high-speed electrometer (Keithley 6514, up to 1200 readings/sec). The grounded faraday cage used as a noise shield from electromagnetic interference (EMI) surrounded the NEMS energy harvester thus attenuating the extrinsic noise and preserving the piezoelectric NWs linear characteristics. The burst chirp signals for FRF characterization were generated using Spectral Dynamics Siglab data acquisition (DAQ) system (Model 50-21) from virtual function generator (vfg) in the MATLAB environment. All other signals were generated and acquired through a DAQ board (NI USB 4431) operated using NI SignalExpress software. All signals were re-examined for accuracy during data acquisition using an oscilloscope (Tektronix, DPO 3014 Digital Phosphor Oscilloscope).

[1] Wang, Z. L., 2012, "Self-Powered Nanosensors and Nanosystems," Advanced Materials, 24(2) pp. 280-285.

[2] Falconi, C., Mantini, G., D'Amico, A., 2009, "Studying Piezoelectric Nanowires and Nanowalls for Energy Harvesting" Sensors and Actuators B: Chemical, 139(2) pp. 511-519.

[3] Cha, S. N., Seo, J., Kim, S. M., 2010, "Sound-Driven Piezoelectric Nanowire-Based Nanogenerators" Advanced Materials, 22(33) pp. 4726-4730.

[4] Wang, X., Song, J., Liu, J., 2007, "Direct-Current Nanogenerator Driven by Ultrasonic Waves" Science (New York, N.Y.), 316(5821) pp. 102-105.

[5] Liu, J., Fei, P., Zhou, J., 2008, "Toward High Output-Power Nanogenerator" Applied Physics Letters, 92(17) pp. 173105.

[6] Wang, Liu, J., Song, 2007, "Integrated Nanogenerators in Biofluid" Nano Letters, 7(8) pp. 2475-2479.

[7] Choi, M., Choi, D., Jin, M., 2009, "Mechanically Powered Transparent Flexible Charge-Generating Nanodevices with Piezoelectric ZnO Nanorods" Advanced Materials, 21(21) pp. 2185-2189.

[8] Chen, X., Xu, S., Yao, N., 2010, "1.6 V Nanogenerator for Mechanical Energy Harvesting using PZT Nanofibers" Nano Letters.

[9] Wang, Z. L., and Song, J., 2006, "Piezoelectric Nanogenerators Based on Zinc Oxide Nanowire Arrays" Science (New York, N.Y.), 312(5771) pp. 242-246.

[10] Gao, P. X., Song, J., Liu, J., 2007, "Nanowire Piezoelectric Nanogenerators on Plastic Substrates as Flexible Power Sources for Nanodevices" Advanced Materials, 19(1) pp. 67-72.

[11] Yang, R., Qin, Y., Li, C., 2009, "Converting Biomechanical Energy into Electricity by a Muscle-Movement-Driven Nanogenerator" Nano Letters, 9(3) pp. 1201-1205.

[12] Hansen, B. J., Liu, Y., Yang, R., 2010, "Hybrid Nanogenerator for Concurrently Harvesting Biomechanical and Biochemical Energy" ACS Nano.

[13] Xu, S., Hansen, B. J., and Wang, Z. L., 2010, "Piezoelectric-Nanowire-Enabled Power Source for Driving Wireless Microelectronics" Nature Communications, 1(7) pp. 93.

[14] Qi, Y., Jafferis, N. T., Lyons, K., 2010, "Piezoelectric Ribbons Printed Onto Rubber for Flexible Energy Conversion" Nano Letters.

[15] Qi, Y., Kim, J., Nguyen, T. D., 2011, "Enhanced Piezoelectricity and Stretchability in Energy Harvesting Devices Fabricated from Buckled PZT Ribbons" Nano Letters.

[16] Park, K., Xu, S., Liu, Y., 2010, "Piezoelectric BaTiO3 Thin Film Nanogenerator on Plastic Substrates," Nano Letters, 10(12) pp. 4939-4943.

[17] Wang, Z., Hu, J., Suryavanshi, A. P., 2007, "Voltage Generation from Individual BaTiO3 Nanowires under Periodic Tensile Mechanical Load," Nano Letters, 7(10) pp. 2966-2969.

[18] Park, K., Lee, S. Y., Kim, S., 2010, "Bendable and Transparent Barium Titanate Capacitors on Plastic Substrates for High Performance Flexible Ferroelectric Devices" Electrochemical and Solid-State Letters, 13(7) pp. G57.

[19] Sun, C., Shi, J., and Wang, X., 2010, "Fundamental Study of Mechanical Energy Harvesting using Piezoelectric Nanostructures" Journal of Applied Physics, 108(3) pp. 034309.

[20] Yu, A., Jiang, P., and Lin Wang, Z., 2012, "Nanogenerator as Self-Powered Vibration Sensor," Nano Energy, 1(3) pp. 418-423.

[21] Williams, M. D., Griffin, B. A., Reagan, T. N., 2012, "An AlN MEMS Piezoelectric Microphone for Aeroacoustic Applications" Journal of Microelectromechanical Systems, 21(2) pp. 270-283.

[22] 'Linear Technology', 2011, "LTC6240/LTC6241/LTC6242 Single/Dual/Quad 18 MHz, Low Noise, Rail-to-Rail Output, CMOS Op Amps," Linear Technology.

[23] Kong, N., Ha, D. S., Erturk, A., 2010, "Resistive Impedance Matching Circuit for Piezoelectric Energy Harvesting," Journal of Intelligent Material Systems and Structures, 21(13) pp. 1293-1302.

1. Bao, N., Shen, L., Srinivasan, G., Yanagisawa, K. & Gupta, A. Shape-controlled monocrystalline ferroelectric barium titanate nanostructures: From nanotubes and nanowires to ordered nanostructures. *J. Phys. Chem. C* 112, 8634-8642 (2008).
2. Chen, D. et al. Well-ordered arrays of ferroelectric single-crystalline BaTiO3 nanostructures *Physica Status Solidi A* 209, 714-717 (2012).
3. Maxim, F., Ferreira, P., Vilarinho, P. M. & Reaney, I. Hydrothermal synthesis and crystal growth studies of BaTiO3 Using Ti nanotube precursors. *Cryst. Growth Des.* 8, 3309-3315 (2008).
4. Chatterjee, S., Bhattacharyya, S., Khushalani, D. & Ayyub, P. Hydrothermally synthesized aligned arrays of self-assembled multiwalled hydrogen titanate nanotubes. *Cryst. Growth Des.* 10, 1215-1220 (2010).
5. Liu, B., Boercker, J. E. & Aydil, E. S. Oriented single crystalline titanium dioxide nanowires *Nanotechnology* 19, 505604 (2008).
6. Kang, S., Park, B. H. & Kim, Y. Growth mechanism of shape-controlled barium titanate nanostructures through soft chemical reaction. *Cryst. Growth Des.* 8, 3180-3186 (2008).
7. Kralchevsky, P. A. & Nagayama, K. Capillary forces between colloidal particles. *Langmuir* 10, 23-36 (1994).
8. Zárate, R. A., Fuentes, S., Wiff, J. P., Fuenzalida, V. M. & Cabrera, A. L. Chemical composition and phase identification of sodium titanate nanostructures grown from titania by hydrothermal processing. *J. Phys. Chem. Solids* 68, 628-637 (2007).
9. Morgado Jr., E. et al. A study on the structure and thermal stability of titanate nanotubes as a function of sodium content. *Solid State Sci.* 8, 888-900 (2006).
10. LTC6240/LTC6241/LTC6242 Single/Dual/Quad 18 MHz, Low noise, Rail-to-Rail Output, CMOS Op Amps. *Linear Technology* (2011).
11. Liu, W. Q., Feng, Z. H., Liu, R. B. & Zhang, J. The influence of preamplifiers on the piezoelectric sensor's dynamic property. *Rev. Sci. Instrum.* 78, 125107-4 (2007).
12. Huang, K., Huang, T. & Hsieh, W. Morphology-controlled synthesis of Barium Titanate nanostructures. *Inorg. Chem.* 48, 9180-9184 (2009).
13. Enochson, L. D. Frequency response functions & coherence functions for multiple input linear systems. NASA NASA-CR-32, 80 P REFS (1964).
14. Wen, X., Wu, W., Ding, Y. & Wang, Z. L. Seedless synthesis of patterned ZnO nanowire arrays on metal thin films (Au, Ag, Cu, Sn) and their application for flexible electromechanical sensing. *J. Mater. Chem.* 22, 9469-9476 (2012).
15. Tian, J. H., et al. Improved seedless hydrothermal synthesis of dense and ultralong ZnO nanowires. *Nanotechnology* 22, 245601 (2011).

(1) Tadigadapa, S. & Mateti, K. Piezoelectric MEMS sensors: state-of-the-art and perspectives. Meas. Sci. Technol. 20, 092001 (2009).
(2) Wang, X. Piezoelectric nanogenerators—harvesting ambient mechanical energy at the nanometer scale. Nano Energy 1, 13-24 (2012).
(3) Espinosa, H. D., Bernal, R. A. & Minary-Jolandan, M. A review of mechanical and electromechanical properties of piezoelectric nanowires. Adv. Mater. 24, 4656-4675 (2012).
(4) Yan, Z. & Jiang, L. Surface effects on the electromechanical coupling and bending behaviors of piezoelectric nanowires. J. Phys. D Appl. Phys. 44, 075404 (2011).
(5) Cha, S. N. et al. Sound-driven piezoelectric nanowire-based nanogenerators. Adv. Mater. 22, 4726-4730 (2010).
(6) Wang, X., Song, J., Liu, J. & Wang, Z. L. Direct-current nanogenerator driven by ultrasonic waves. Science 316, 102-105 (2007).
(7) Liu, J., Fei, P., Zhou, J., Tummala, R. & Wang, Z. L. Toward high output-power nanogenerator. Appl. Phys. Lett. 92, 173105 (2008).
(8) Wang, L. i. u., Song, J. & Wang, Z. L. Integrated nanogenerators in biofluid. Nano Lett. 7, 2475-2479 (2007).
(9) Choi, M. et al. Mechanically powered transparent flexible charge-generating nanodevices with piezoelectric ZnO nanorods. Adv. Mater. 21, 2185-2189 (2009).
(10) Chen, X., Xu, S., Yao, N. & Shi, Y. 1.6V nanogenerator for mechanical energy harvesting using PZT nanofibers. Nano Lett. 10, 2133-2137 (2010).
(11) Wang, Z. L. & Song, J. Piezoelectric nanogenerators based on zinc oxide nanowire arrays. Science 312, 242-246 (2006).
(12) Gao, P. X., Song, J., Liu, J. & Wang, Z. L. Nanowire piezoelectric nanogenerators on plastic substrates as flexible power sources for nanodevices. Adv. Mater. 19, 67-72 (2007).
(13) Yang, R., Qin, Y., Li, C., Zhu, G. & Wang, Z. L. Converting biomechanical energy into electricity by a muscle-movement-driven nanogenerator. Nano Lett. 9, 1201-1205 (2009).
(14) Hansen, B. J., Liu, Y., Yang, R. & Wang, Z. L. Hybrid nanogenerator for concurrently harvesting biomechanical and biochemical energy. ACS Nano 4, 3647-3652 (2010).
(15) Sun, C., Shi, J. & Wang, X. Fundamental study of mechanical energy harvesting using piezoelectric nanostructures. J. Appl. Phys. 108, 034309 (2010).
(16) Yu, A., Jiang, P. & Lin Wang, Z. Nanogenerator as self-powered vibration sensor. Nano Energy 1, 418-423 (2012).
(17) Zhou, J. et al. Flexible piezotronic strain sensor. Nano Lett. 8, 3035-3040 (2008).
(18) Wang, X. et al. Piezoelectric field effect transistor and nanoforce sensor based on a single ZnO nanowire. Nano Lett. 6, 2768-2772 (2006).
(19) Xu, S., Hansen, B. J. & Wang, Z. L. Piezoelectric-nanowire-enabled power source for driving wireless microelectronics. Nat. Commun. 1, 93 (2010).
(20) Chen, C. et al. Electricity generation based on vertically aligned PbZr0.2Ti0.8O3 nanowire arrays. Nano Energy 1, 424-428 (2012).
(21) Lin, Y., Liu, Y. & Sodano, H. A. Hydrothermal synthesis of vertically aligned lead zirconate titanate nanowire arrays. Appl. Phys. Lett. 95, 122901 (2009).
(22) Panda, P. K. Review: environmental friendly lead-free piezoelectric materials. J. Mater. Sci. 44, 5049-5062 (2009).
(23) Kralchevsky, P. A. & Nagayama, K. Capillary forces between colloidal particles. Langmuir 10, 23-36 (1994).
(24) Bao, N., Shen, L., Srinivasan, G., Yanagisawa, K. & Gupta, A. Shape-controlled monocrystalline ferroelectric

(24) barium titanate nanostructures: From nanotubes and nanowires to ordered nanostructures. J. Phys. Chem. C 112, 8634-8642 (2008).
(25) Bao, N. et al. Size-controlled one-dimensional monocrystalline BaTiO3 nanostructures. Appl. Phys. Lett. 94, 253109-253109-3 (2009).
(26) Wu, Z. & Yoshimura, M. Investigations on procedures of the fabrication of barium titanate ceramic films under hydrothermal-electrochemical conditions. Solid State Ionics 122, 161-172 (1999).
(27) Huang, L. et al. Barium titanate nanocrystals and nanocrystal thin films: Synthesis, ferroelectricity, and dielectric properties. J. Appl. Phys. 100, 034316-034316-10 (2006).
(28) Albarbar, A., Badri, A., Sinha, J. K. & Starr, A. Performance evaluation of MEMS accelerometers. Measurement 42, 790-795 (2009).
(29) Enochson, L. D. Frequency Response Functions & Coherence Functions For Multiple Input Linear Systems. National Aeronautics and Space Administration NASA-CR-32, 80P REFS (1964).
(30) Huang, K., Huang, T. & Hsieh, W. Morphology-controlled synthesis of barium titanate nanostructures. Inorg. Chem. 48, 9180-9184 (2009).
(31) Chang, J., Dommer, M., Chang, C. & Lin, L. Piezoelectric nanofibers for energy scavenging applications. Nano Energy 1, 356-371 (2012).
(32) Yang, R., Qin, Y., Li, C., Dai, L. & Wang, Z. L. Characteristics of output voltage and current of integrated nanogenerators. Appl. Phys. Lett. 94, 022905-3 (2009).
(33) Wang, Z., Hu, J. & Yu, M. Axial polarization switching in ferroelectric BaTiO3 nanowire. Nanotechnology 18, 235203 (2007).
(34. Wen, X., Wu, W., Ding, Y. & Wang, Z. L. Seedless synthesis of patterned ZnO nanowire arrays on metal thin films (Au, Ag, Cu, Sn) and their application for flexible electromechanical sensing. J. Mater. Chem. 22, 9469-9476 (2012).
(35) Tian, J. H. et al. Improved seedless hydrothermal synthesis of dense and ultralong ZnO nanowires. Nanotechnology 22, 245601 (2011).
(36) Wang, Z. L. Piezotronic and piezophototronic effects. J. Phys. Chem. Lett. 1, 1388-1393 (2010).
(37) Wu, W., Wen, X. & Wang, Z. L. Taxel-addressable matrix of vertical-nanowire piezotronic transistors for active and adaptive tactile imaging. Science 340, 952-957 (2013).
(38) Liu, B., Boercker, J. E. & Aydil, E. S. Oriented single crystalline titanium dioxide nanowires. Nanotechnology 19, 505604 (2008).
(39) Chatterjee, S., Bhattacharyya, S., Khushalani, D. & Ayyub, P. Hydrothermally synthesized aligned arrays of self-assembled multiwalled hydrogen titanate nanotubes. Cryst. Growth Des. 10, 1215-1220 (2010).
(40) Williams, M. D., Griffin, B. A., Reagan, T. N., Underbrink, J. R. & Sheplak, M. An AlN MEMS piezoelectric microphone for aeroacoustic applications. J. Microelectromech. Syst. 21, 270-283 (2012).
(41) LTC6240/LTC6241/LTC6242 Single/Dual/Quad 18 MHz, Low noise, Rail-to-Rail Output, CMOS Op Amps. Linear Technology (2011).
(42) Chen, D. et al. Well-ordered arrays of ferroelectric single-crystalline BaTiO3 nanostructures. Phys. Stat. Solidi A 209, 714-717 (2012).
(43) Maxim, F., Ferreira, P., Vilarinho, P. M. & Reaney, I. Hydrothermal synthesis and crystal growth studies of BaTiO3 Using Ti nanotube precursors. Cryst. Growth Des. 8, 3309-3315 (2008).
(44) Kang, S., Park, B. H. & Kim, Y. Growth mechanism of shape-controlled barium titanate nanostructures through soft chemical reaction. Cryst. Growth Des. 8, 3180-3186 (2008).
(45) Za'rate, R. A., Fuentes, S., Wiff, J. P., Fuenzalida, V. M. & Cabrera, A. L. Chemical composition and phase identification of sodium titanate nanostructures grown from titania by hydrothermal processing. J. Phys. Chem. Solids 68, 628-637 (2007).
(46) Morgado, Jr E. et al. A study on the structure and thermal stability of titanate nanotubes as a function of sodium content. Solid State Sci. 8, 888-900 (2006).
(47) Liu, W. Q., Feng, Z. H., Liu, R. B. & Zhang, J. The influence of preamplifiers on the piezoelectric sensor's dynamic property. Rev. Sci. Instrum. 78, 125107-4 (2007).
{1} Z. L. Wang, *Adv. Mater.*, 2012, 24, 280-285.
{2} C. Falconi, G. Mantini, A. D'Amico and Z. L. Wang, *Sensor. Actuat. B: Chem.*, 2009, 139, 511-519.
{3} A. Nechibvute, A. Chawanda and P. Luhanga, *Smart Materials 70 Research.*, 2012, 2012, 13.
{4} S. N. Cha, J. Seo, S. M. Kim, H. J. Kim, Y. J. Park, S. Kim and J. M. Kim, *Adv. Mater.*, 2010, 22, 4726-4730.
{5} X. Wang, J. Song, J. Liu and Z. L. Wang, *Science*, 2007, 316, 102-105.
{6} J. Liu, P. Fei, J. Zhou, R. Tummala and Z. L. Wang, *Appl. Phys. Lett.*, 2008, 92, 173105.
{7} Wang, J. Liu, Song and Z. L. Wang, *Nano Letters*, 2007, 7, 2475-2479.
{8} M. Choi, D. Choi, M. Jin, I. Kim, S. Kim, J. Choi, S. Y. Lee, J. M. Kim and S. Kim, *Adv. Mater.*, 2009, 21, 2185-2189.
{9} X. Chen, S. Xu, N. Yao and Y. Shi, *Nano Lett*, 2010, 10, 2133-2137.
{10} Z. L. Wang and J. Song, *Science*, 2006, 312, 242-246.
{11} P. X. Gao, J. Song, J. Liu and Z. L. Wang, *Adv. Mater.*, 2007, 19, 67-72.
{12} R. Yang, Y. Qin, C. Li, G. Zhu and Z. L. Wang, *Nano Letters*, 2009, 9, 1201-1205.
{13} B. J. Hansen, Y. Liu, R. Yang and Z. L. Wang, *ACS Nano*, 2010, 4, 3647-3652.
{14} S. Xu, Y. Qin, C. Xu, Y. Wei, R. Yang and Z. L. Wang, *Nat. Nanotechnol.*, 2010, 5, 366-373.
{15} A. Yu, P. Jiang and Z. L. Wang, *Nano Energy*, 2012, 1, 418-423.
{16} B. Kumar and S. Kim, *Nano Energy*, 2012, 1, 342-355.
{17} Y. Hu, L. Lin, Y. Zhang and Z. L. Wang, *Adv. Mater.*, 2012, 24, 110-114.
{18} G. Zhu, A. C. Wang, Y. Liu, Y. Zhou and Z. L. Wang, *Nano Lett.*, 2012, 12, 3086-3090.
{19} S. Xu, B. J. Hansen and Z. L. Wang, *Nat. Commun.*, 2010, 1, 93.
{20} Y. Qi, N. T. Jafferis, K. Lyons, C. M. Lee, H. Ahmad and M. C. McAlpine, *Nano Lett.*, 2010, 10, 524-528.
{21} Y. Qi, J. Kim, T. D. Nguyen, B. Lisko, P. K. Purohit and M. C. McAlpine, *Nano Lett.*, 2011, 11, 1331-1336.
{22} Y. Lin, Y. Liu and H. A. Sodano, *Appl. Phys. Lett.*, 2009, 95, 122901.
{23} Z. Wang, J. Hu, A. P. Suryavanshi, K. Yum and M. Yu, *Nano Lett.*, 2007, 7, 2966-2969.
{24} K. Park, S. Xu, Y. Liu, G. Hwang, S. L. Kang, Z. L. Wang and K. J. Lee, *Nano Lett.*, 2010, 10, 4939-4943.
{25} Z. Lin, Y. Yang, J. M. Wu, Y. Liu, F. Zhang and Z. L. Wang, *J Phys. Chem. Letters*, 2012, 3, 3599-3604.
{26} P. K. Panda, *J. Mater. Sci.*, 2009, 44, 5049-5062.
{27} C. Sun, J. Shi and X. Wang, *J. Appl. Phys.*, 2010, 108, 034309.

{28} J. I. Sohn, S. N. Cha, B. G. Song, S. Lee, S. M. Kim, J. Ku, H. J. Kim, Y. J. Park, B. L. Choi, Z. L. Wang, J. M. Kim and K. Kim, *Energy Environ. Sci.*, 2013, 6, 97-104.

{29} T. T. Pham, K. Y. Lee, J. Lee, K. Kim, K. Shin, M. K. Gupta, B. Kumar and S. Kim, *Energy & Environ. Sci.*, 2013, 6, 841-846.

{30} N. Setter, *Electroceramic based mems: fabrication-technology and applications*, Springer, 2005.

{31} P. M. Rørvik, T. Grande and M. Einarsrud, *Adv. Mater.*, 2011, 23, 4007-4034.

{32} J. J. Urban, J. E. Spanier, L. Ouyang, W. S. Yun and H. Park, *Adv. Mater.*, 2003, 15, 423-426.

{33} J. J. Urban, W. S. Yun, Q. Gu and H. Park, *J. Am. Chem. Soc.*, 2002, 124, 1186-1187.

{34} U. A. Joshi, S. Yoon, S. Baik and J. S. Lee, *J. Phys. Chem. B.*, 2006, 110, 12249-12256.

{35} S. O. Leontsev and R. E. Eitel, *Sci. Technol. Adv. Mat.*, 2010, 11, 044302.

{36} H. D. Espinosa, R. A. Bernal and M. Minary-5 Jolandan, *Adv. Mater.*, 2012, 24, 4656-4675.

{37} Z. Yan and L. Jiang, *J. Phys. D*, 2011, 44, 075404.

{38} L. E. Greene, B. D. Yuhas, M. Law, D. Zitoun and P. Yang, *Inorg. Chem.*, 2006, 45, 7535-7543.

{39} U. Galan, Y. Lin, G. J. Ehlert and H. A. Sodano, *Composites Sci. Technol.*, 2011, 71, 946-954.

{40} C. S. Lao, J. Liu, P. Gao, L. Zhang, D. Davidovic, R. Tummala and Z. L. Wang, *Nano lett.*, 2006, 6, 263-266.

{41} W. J. Merz, *Phys. Rev.*, 1954, 95, 690.

{42} N. Kong, D. S. Ha, A. Erturk and D. J. Inman, *J. Intell. Mater. Syst. Struct*, 2010, 21, 1293-1302.

{43} S. Priya, *J. Electroceram.*, 2007, 19, 167-184.

{44} V. R. Challa, M. G. Prasad and F. T. Fisher, *Smart Mater. Struct.*, 2009, 18, 095029.

{45} W. J. Choi, Y. Jeon, J.-H. Jeong, R. Sood and S. G. Kim, *J. Electroceram.*, 2006, 17, 543-548.

{46} D. Shen, J.-H. Park, J. Ajitsaria, S.-Y. Choe, H. C. Wikle and D. Kim, *J. Micromech. Microeng.*, 2008, 18, 055017.

{47} B. Liu and E. S. Aydil, *J. Am. Chem. Soc.*, 2009, 131, 3985-3990.

{48} B. Im, U. A. Joshi, K. H. Lee and J. S. Lee, *Nanotechnology*, 2010, 21, 425601.

{49} Z. Zhou, Y. Lin, H. Tang and H. A. Sodano, *Nanotechnology*, 2013, 24, 095602.

{50} H. Tang, Y. Lin and H. A. Sodano, *Adv. Energy Mater.*, 2012, 3, 451-456.

{51} N. Bao, L. Shen, G. Srinivasan, K. Yanagisawa and A. Gupta, *J. Phys. Chem. C.*, 2008, 112, 8634-8642.

{52} M. A. McCormick and E. B. Slamovich, *J. Eur. Ceram. Soc.*, 2003, 23, 2143-2152.

{53} C. Xu and D. Gao, *J. Phys. Chem. C.*, 2012, 116, 7236-7241.

{54} 'Linear Technology', *LTC6240/LTC6241/LTC6242 Single/Dual/Quad 18 MHz, Low noise, Rail-to-Rail Output, CMOS Op Amps*, 2011.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. A method of preparing an aligned piezoelectric $BaTiO_3$ nanowire array comprising: providing a conductive substrate; providing a $TiO_2$ precursor;
   growing a $TiO_2$ nanowire array from the $TiO_2$ precursor on the conductive substrate;
   providing a solution comprising barium hydroxide;
   combining the solution with the $TiO_2$ nanowire array; and
   heating the combination, wherein the $TiO_2$ nanowire array is converted to a barium titanate nanowire array with equivalent length nanowires to the $TiO_2$ nanowires.

2. The method according to claim 1, wherein the $TiO_2$ precursor is titanium isopropoxide.

3. The method according to claim 1, wherein the $TiO_2$ nanowires are 0.5 to 50 µm in length.

4. The method according to claim 1, wherein the heating is to a temperature between 150 and 250° C.

5. The method according to claim 1, wherein the conductive substrate is fluorine doped tin oxide (FTO) glass.

* * * * *